United States Patent [19]
Burns

[11] Patent Number: 6,049,123
[45] Date of Patent: Apr. 11, 2000

[54] ULTRA HIGH DENSITY INTEGRATED CIRCUIT PACKAGES

[75] Inventor: Carmen D. Burns, Austin, Tex.

[73] Assignee: Staktek Corporation, Austin, Tex.

[21] Appl. No.: 08/935,380

[22] Filed: Sep. 22, 1997

Related U.S. Application Data

[62] Division of application No. 08/516,372, Aug. 17, 1995, abandoned, which is a division of application No. 08/452,213, May 26, 1995, abandoned, which is a division of application No. 08/133,395, Oct. 8, 1993, Pat. No. 5,446,620, which is a division of application No. 07/884,066, May 15, 1992, abandoned, which is a continuation-in-part of application No. 07/561,417, Aug. 1, 1990, abandoned.

[51] Int. Cl.[7] .................................................. H01L 23/02
[52] U.S. Cl. .......................... 257/686; 257/712; 257/723
[58] Field of Search ................................... 257/685, 686, 257/723, 724, 725, 726, 712

[56] References Cited

U.S. PATENT DOCUMENTS

| | | | |
|---|---|---|---|
| 2,921,550 | 1/1960 | Goodykoontz, Jr. et al. | 113/99 |
| 3,401,369 | 9/1968 | Palmateer et al. | 339/17 |
| 3,436,604 | 4/1969 | Hyltin et al. | 317/101 |
| 3,534,470 | 10/1970 | Faure et al. | 29/603 |
| 3,614,546 | 10/1971 | Avins | 317/234 R |
| 3,675,299 | 7/1972 | Sherrill, Jr. | 29/203 |
| 3,713,893 | 1/1973 | Shirland | 437/205 X |
| 3,739,462 | 6/1973 | Hasty | 29/577 |
| 3,746,934 | 7/1973 | Stein | 317/101 |
| 4,103,318 | 7/1978 | Schwede | 361/388 |
| 4,139,726 | 2/1979 | Penrod et al. | 174/52 |
| 4,158,745 | 6/1979 | Keller | 174/52 FP |
| 4,222,516 | 9/1980 | Badet et al. | 235/492 |
| 4,241,493 | 12/1980 | Andrulits et al. | 437/209 X |
| 4,288,841 | 9/1981 | Gogal | 361/414 |
| 4,321,418 | 3/1982 | Dran et al. | 264/102 X |
| 4,437,235 | 3/1984 | McIver | 29/840 |
| 4,451,973 | 6/1984 | Tateno et al. | 29/588 |
| 4,501,960 | 2/1985 | Jouvet et al. | 235/492 |
| 4,521,828 | 6/1985 | Fanning | 361/386 |
| 4,525,921 | 7/1985 | Carson et al. | 29/577 |
| 4,530,152 | 7/1985 | Roche et al. | 29/588 |

(List continued on next page.)

FOREIGN PATENT DOCUMENTS

| | | |
|---|---|---|
| 122-687-A | 10/1984 | European Pat. Off. . |
| 0-298 211 | 11/1989 | European Pat. Off. . |
| 340100 | 11/1989 | European Pat. Off. . |
| 57-31166 | 2/1982 | Japan . |

(List continued on next page.)

OTHER PUBLICATIONS

Catalog of Dense–Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870.

IBM Technical Disclosure Bulletin, vol. 22, No. 6, pp. 2336–2337 (Flexible Semiconductor Credit Card).

IBM Technical Disclosure Bulletin, vol. 10, No. 10 (Mar. 1968), pp. 1584–1585 (Mount for Semiconductor Device).

"Electronic Packaging and Interconnection Handbook, " pp. 7.24–7.27, C. Harper.

Primary Examiner—Kevin M. Picardat
Attorney, Agent, or Firm—Fulbright & Jaworski, LLP

[57] ABSTRACT

Thin and durable level-one and level-two integrated circuit packages are provided. A thin and durable level-one package is achieved in one method involving a molding technique of evenly applying molding compound to an integrated circuit die element. The casing surrounding a die element may be reduced or eliminated in part to thin the level-one package provided any necessary steps are taken to ensure the integrity of the package. Moisture-barriers, as an example, may be provided to the upper and/or lower surfaces of the thin level-one package. Additionally, a thin level-one package may also be constructed with one or more metal layers to prevent warpage. These level-one packages may be aligned in a stacked configuration to form a thin and durable horizontal level-two package. Various thermal conductors may be thermally coupled to the level-two package to help dissipate heat.

20 Claims, 25 Drawing Sheets

U.S. PATENT DOCUMENTS

| | | | |
|---|---|---|---|
| 4,630,172 | 12/1986 | Stenerson et al. | 361/386 |
| 4,633,573 | 1/1987 | Scherer | 29/589 |
| 4,665,614 | 5/1987 | Stipanuk et al. | 29/884 |
| 4,680,617 | 7/1987 | Ross | 357/72 |
| 4,684,975 | 8/1987 | Takiar et al. | 357/70 |
| 4,722,060 | 1/1988 | Quinn et al. | 364/490 |
| 4,733,461 | 3/1988 | Nakano | 29/830 |
| 4,763,188 | 8/1988 | Johnson | 357/74 |
| 4,780,087 | 10/1988 | Berg et al. | 439/62 |
| 4,796,078 | 1/1989 | Phelps, Jr. et al. | 357/68 |
| 4,821,148 | 4/1989 | Kobayashi et al. | 361/392 |
| 4,823,234 | 4/1989 | Konishi et al. | 361/386 |
| 4,829,403 | 5/1989 | Harding | 361/386 |
| 4,833,568 | 5/1989 | Berhold | 361/383 |
| 4,839,717 | 6/1989 | Phy et al. | 357/74 |
| 4,855,868 | 8/1989 | Harding | 361/386 |
| 4,862,245 | 8/1989 | Pashby et al. | 357/70 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,888,307 | 12/1989 | Spairisano et al. | 437/216 |
| 4,891,789 | 1/1990 | Quattrini et al. | 365/63 |
| 4,922,324 | 5/1990 | Sude | 357/74 |
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,956,694 | 9/1990 | Eide | 387/74 |
| 4,994,411 | 2/1991 | Naito et al. | 437/217 |
| 4,997,517 | 3/1991 | Parthasarathi | 156/630 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 357/80 |
| 5,065,277 | 11/1991 | Davidson | 361/383 |
| 5,086,018 | 2/1992 | Conru et al. | 437/237 |
| 5,089,876 | 2/1992 | Ishioka | 357/70 |
| 5,099,393 | 3/1992 | Bentlage et al. | 361/413 |
| 5,105,530 | 4/1992 | Mos et al. | 29/603 |
| 5,108,553 | 4/1992 | Foster et al. | 29/852 |
| 5,130,889 | 7/1992 | Hamburgen et al. | 361/388 |
| 5,138,430 | 8/1992 | Gow, 3rd et al. | 357/70 |
| 5,138,434 | 8/1992 | Wood et al. | 357/74 |
| 5,139,969 | 8/1992 | Mori | 437/183 |
| 5,147,822 | 9/1992 | Yamazaki et al. | 437/215 |
| 5,151,559 | 9/1992 | Conru et al. | 174/52.4 |
| 5,155,068 | 10/1992 | Tada | 437/211 |
| 5,200,362 | 4/1993 | Lin et al. | 437/207 |
| 5,214,845 | 6/1993 | King et al. | 29/841 |
| 5,216,283 | 6/1993 | Lin | 257/787 |
| 5,223,739 | 6/1993 | Katsumata et al. | 257/676 |
| 5,247,423 | 9/1993 | Lin et al. | 361/719 |
| 5,264,990 | 11/1993 | Venambra | 361/761 |
| 5,266,834 | 11/1993 | Nishi et al. | 257/706 |
| 5,279,029 | 1/1994 | Burns | 29/856 |
| 5,281,852 | 1/1994 | Normington | 257/685 |
| 5,343,075 | 8/1994 | Nishino | 257/686 |
| 5,367,766 | 11/1994 | Burns et al. | 29/848 |
| 5,377,077 | 12/1994 | Burns | 361/704 |
| 5,420,751 | 5/1995 | Burns | 361/707 |
| 5,446,620 | 8/1995 | Burns | 361/704 |
| 5,475,920 | 12/1995 | Burns et al. | 29/856 |
| 5,499,160 | 3/1996 | Burns | 361/704 |
| 5,543,664 | 8/1996 | Burns | 257/787 |
| 5,550,711 | 8/1996 | Burns et al. | 361/728 |
| 5,561,591 | 10/1996 | Burns | 361/704 |
| 5,566,051 | 10/1996 | Burns | 361/704 |

FOREIGN PATENT DOCUMENTS

| | | | |
|---|---|---|---|
| 58-96756A | 6/1983 | Japan . | |
| 58-112348 | 7/1983 | Japan . | |
| 61-163652 | 1/1985 | Japan . | |
| 60-180150A | 9/1985 | Japan . | |
| 61-21943 | 9/1986 | Japan | 437/211 |
| 62-76661 | 8/1987 | Japan | 257/796 |
| 62-230027 | 10/1987 | Japan | 437/209 |
| 63-187652 | 3/1988 | Japan | 257/787 |
| 63-117451 | 5/1988 | Japan | 257/692 |
| 63-153849 | 6/1988 | Japan . | |
| 63-53959 | 8/1988 | Japan . | |
| 1-313966A | 12/1989 | Japan | 257/796 |
| 2-60150 | 2/1990 | Japan | 257/787 |
| 2-220792 | 9/1990 | Japan . | |
| 3-167878 | 7/1991 | Japan . | |
| 3-171652 | 7/1991 | Japan . | |
| 700-942 | 12/1979 | U.S.S.R. . | |
| 834-957 | 5/1981 | U.S.S.R. . | |

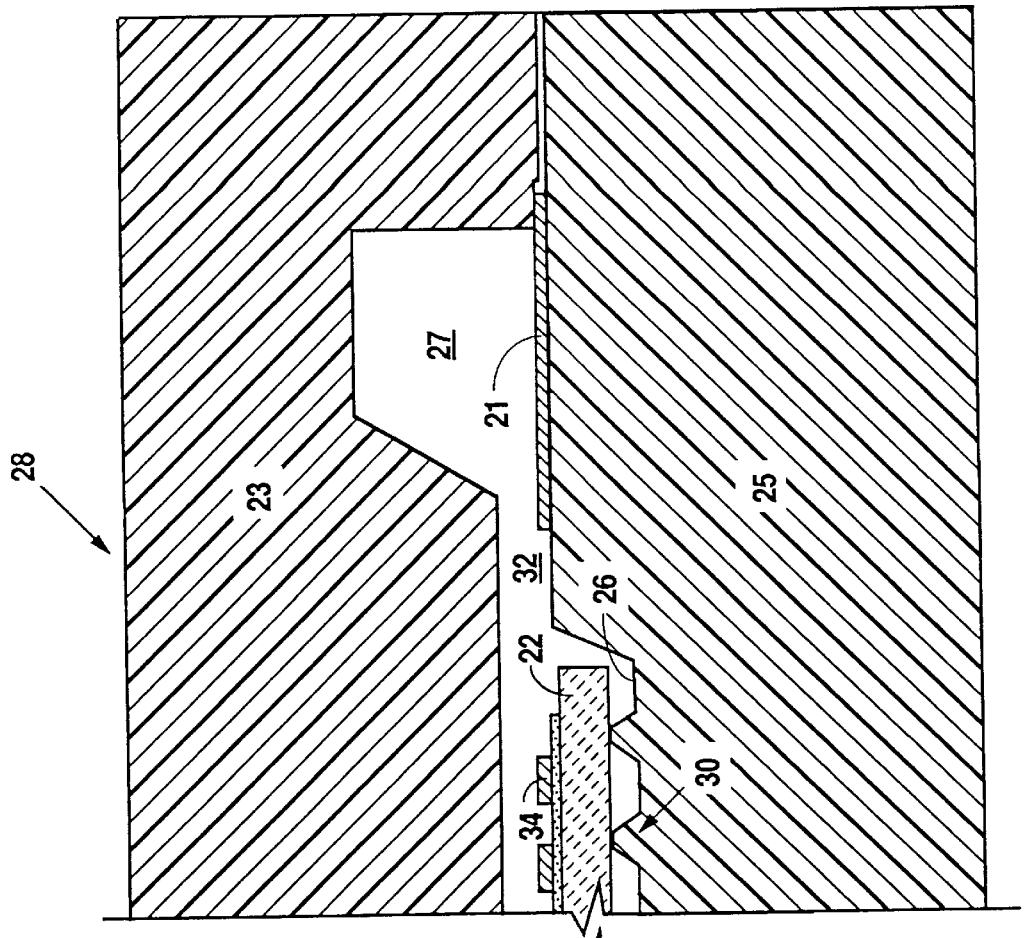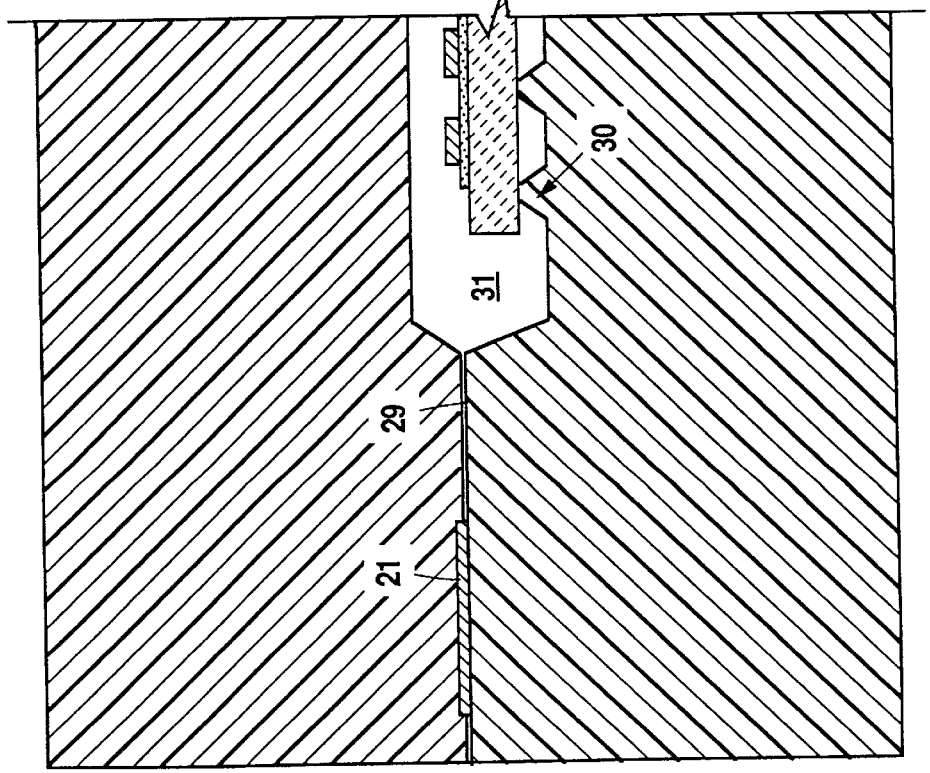
Fig. 6

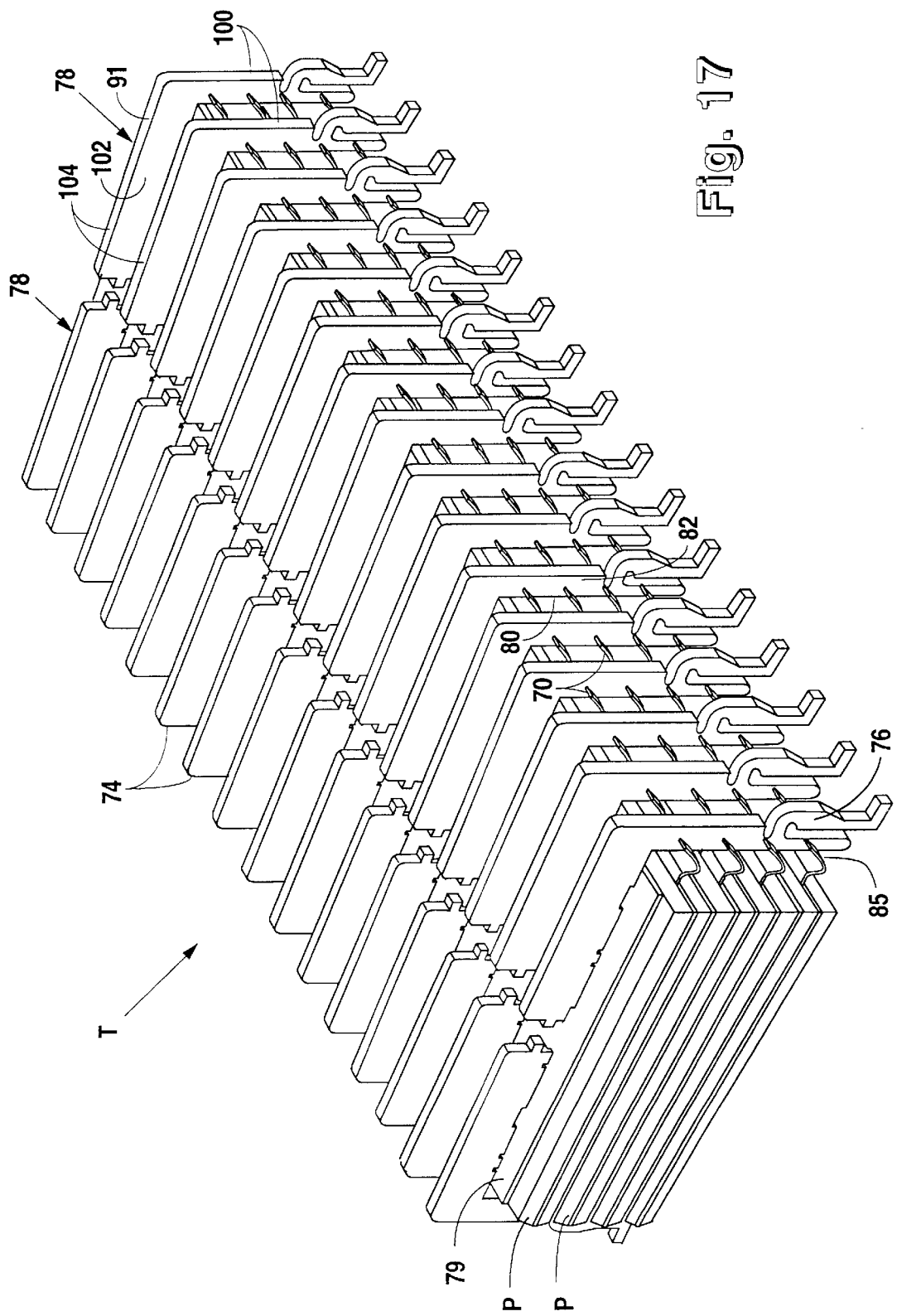

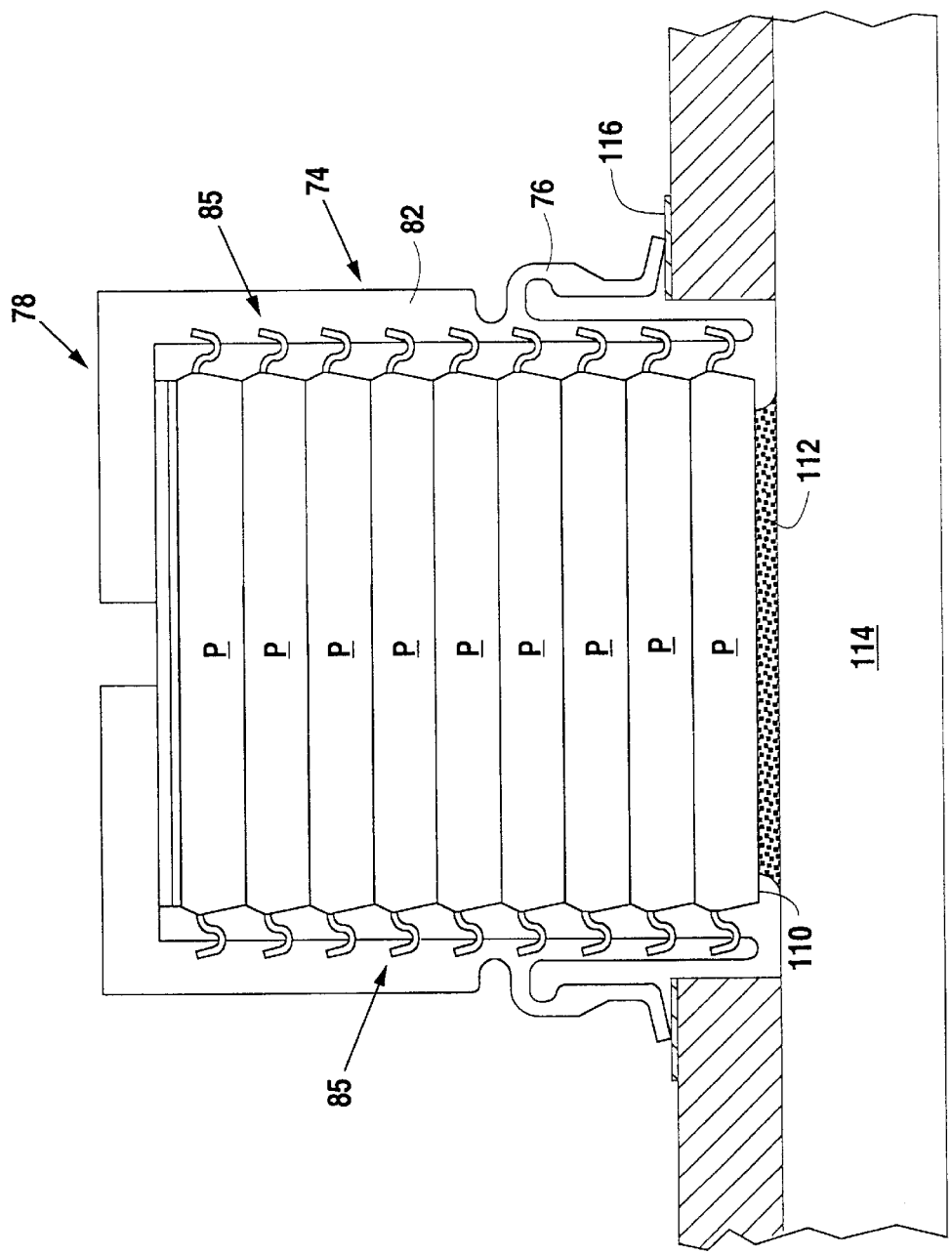

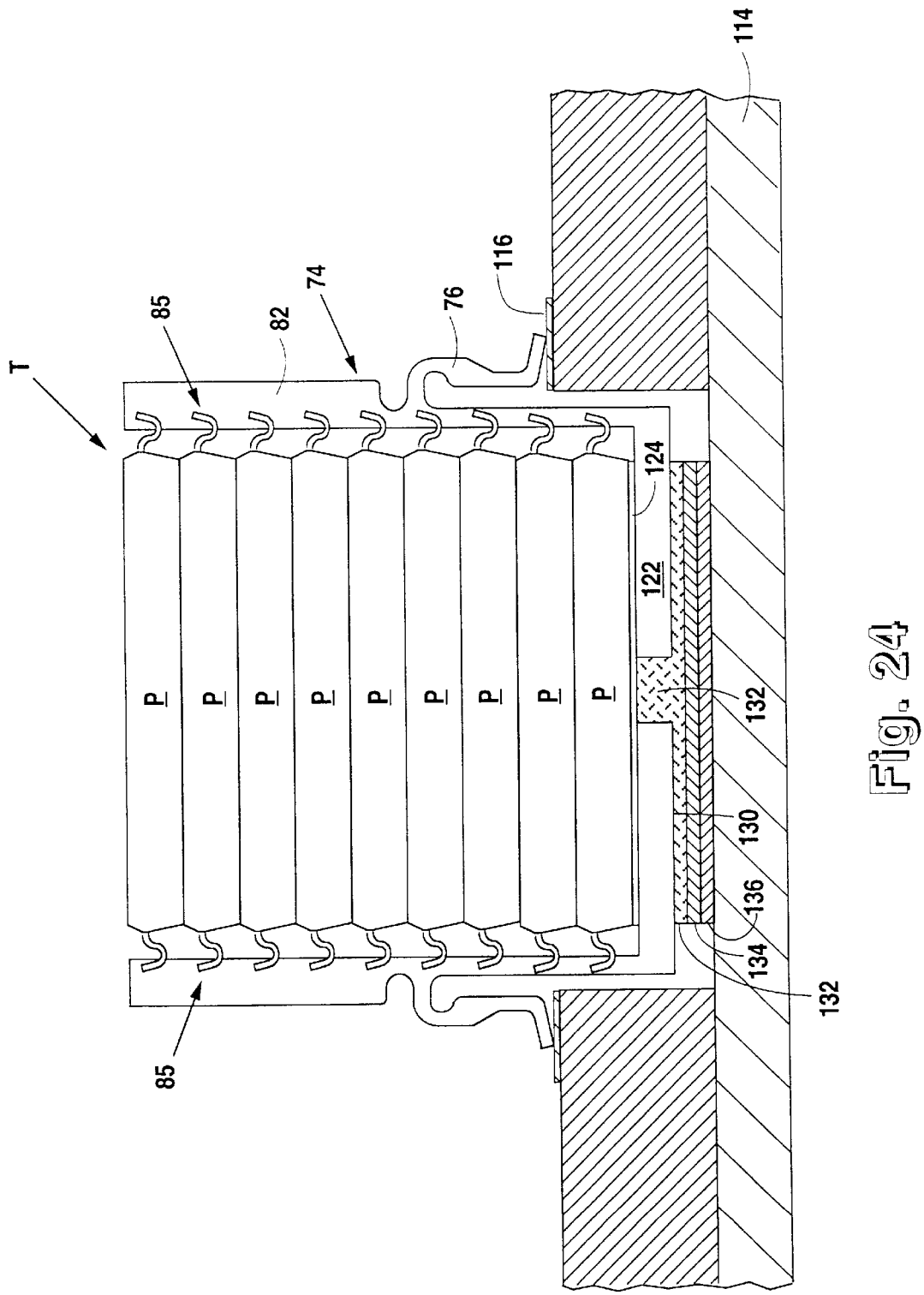

ULTRA HIGH DENSITY INTEGRATED CIRCUIT PACKAGES

SPECIFICATION

This application is a divisional of application Ser. No. 08/516,372, filed Aug. 17, 1995, now abandoned, which is a divisional application of application Ser. No. 08/452,213, filed May 26, 1995, now abandoned, which is a divisional application of application Ser. No. 08/133,395, filed Oct. 8, 1993, now issued as U.S. Pat. No. 5,446,620, which is a divisional application of application Ser. No. 07/884,066, filed May 15, 1992, now abandoned, which is a continuation-in-part application of application Ser. No. 07/561,417, filed Aug. 1, 1990, now abandoned.

BACKGROUND OF THE INVENTION

1. Field of the Invention

This invention relates to a method and apparatus for achieving ultra high density integrated circuit packages incorporating a plurality of ultra-thin encapsulated integrated circuit packages stacked and interconnected into an ultra-high density three-dimensional module.

2. Brief Description of the Related Technology

Packaging techniques for integrated circuits have been developed in the past in an attempt to satisfy demands for miniaturization in the semiconductor industry. Improved methods for miniaturization of integrated circuits enabling the integration of millions of circuit elements into single integrated silicon embodied circuits, or chips, have resulted in increased emphasis on methods to package these circuits in space efficient, yet reliable and mass producible packages.

The introduction of highly sophisticated integrated circuit microprocessors led to the rapid development of complex personal computers and other common bus systems utilizing a variety of integrated circuit elements such as memory devices (DRAMS, VRAMS, FLASH ROMs, E PROMS, and SRAMS), programmable logic arrays (PLAs), microprocessors (CPUs), coprocessors, and other related integrated circuit elements which had to be assembled, mounted and interconnected into as compact, yet reliable packages as feasible to satisfy the industry demands for miniaturization.

Other key considerations in developing packaging for such circuits have been the cost of manufacture, the reliability of the packaged device, heat transfer, moisture penetration, standardization of mounting and interconnect methods, and the ability to test and control the quality of the packaged devices.

In the past, one area of concentration for high density packaging has been memory devices such as SRAMS and DRAMS. Prior systems typically utilized a transfer molded plastic encasement surrounding the integrated circuit and having one of a variety of pin-out or mounting and interconnect schemes. The older M-DIP (Dual-In-Line Plastic) provides a relatively flat, molded package having dual parallel rows of leads extending from the bottom for through-hole connection and mounting to an underlying circuit board substrate. These packages provided 100 mil spacing between leads.

A more dense package was the 100 mil SIP (Single-In-Line-Plastic) which was assembled on edge with two rows of 100-mil staggered leads extending from the bottom edge for through-hole assembly. Another popular prior art package is the PLCC (Plastic Leaded Chip Carrier) SOJ (Small Outline J-leaded) molded package with twenty surface-mount designed J-leads (length 0.67", width 0.34", height 0.14"). This prior art package is illustrated schematically in FIG. 1 and shown at approximate actual size in FIG. 2.

In order to obtain more density and provide lower cost socketability (i.e. removable mounting) and to allow for after-market sale of additional memory units the SIMM (Single-In-Line Memory Module) was developed. This package is schematically illustrated in FIG. 3. In this package typically nine one-megabyte or four-megabyte DRAMS are surface mounted into a socket which is in turn edge-mounted on a large circuit board substrate containing additional sockets or components. While this design provided some increase in density, it had the drawback of providing a module extending from one-half to nearly two inches vertically above the circuit board substrate.

Newer, higher density versions of the SIMM design with even smaller versions of the DRAM plastic package have been developed. These thinner versions of SOJ DRAMS are one-half the thickness (having a plastic packaging thickness of about 70 mils) of standard SOJ designs, and have been mounted on both sides of circuit board substrates. Even smaller TSOP packages have been developed experimentally with a plastic thickness of one millimeter and lower profile gull-wing leads for surface mounting. FIGS. 1–3 illustrate typical embodiments of some of these prior art packages. Based on experience with those prior art designs, for reasons of reliability related to moisture penetration and mechanical integrity, the industry has adopted a standard thickness for plastic packaging of approximately one millimeter (40 mils), or approximately 10.5 mils on each side of a 11 mil thick integrated circuit element attached to a 8 mil thick lead frame.

In contrast to such prior art systems, the packaging method of the present invention provides a reliable, cost efficient, easily manufacturable package with a plurality of ultra thin level-one package elements assembled in an integrated module or level-two package which can be mounted to a circuit board substrate directly or via an underlying socket or header.

SUMMARY OF THE INVENTION

The present invention provides new and useful embodiments of thin, yet durable and reliable, level-one packages and horizontal level-two packages.

It has been discovered that one effective way to achieve a thin and durable integrated circuit level-one package is to ensure that the casing that is molded around the die element is distributed somewhat evenly around the entire surface of the die element. The present invention provides various embodiments to achieve this result.

In one embodiment, the die element is supported in the mold, at either its bottom or top surface, by pins or supports which prevent the die element from resting flush with the bottom or top surface of the mold. Molding compound is applied on the die element surface opposite the surface supported by the supports or pins. The fluid pressure caused by the molding compound holds the die element in its proper position on the pins or supports. Since the die element is held in a horizontal position and does not rest on the top or bottom surface of the mold, the molding compound distributes somewhat evenly around all the surfaces of the integrated circuit die element. Since the molding compound distributes evenly around the integrated circuit die element, the molding compound can be applied thinner without fear that any side of the die will be inadequately covered by sufficient thickness of molding compound and, therefore, the overall integrated circuit package is thinner. The die element may be supported in the mold at both its top and bottom surface by supports. In such an embodiment, it does not matter what surface the molding compound is applied to. It is important to note that the above-described molding techniques provide thin integrated circuit packages which significantly reduce the likelihood of breaking, warping or destroying the integrity of the integrated circuit package for packages having an overall thickness of as little as twenty to twenty six mils.

In another embodiment, the integrated circuit is supported in the mold by fixed or retractable pins formed integrally with the bottom and/or upper surface or the mold. The supports may also be formed by epoxy or some other material affixed to the bottom and/or upper surfaces of the die element. When the fixed pins are used as the supports, pin holes or cavities will be left in the molded casing of the integrated circuit die element. The pin cavities may be filled in with epoxy or a secondary epoxy layer can be applied over all the surfaces of the casing. To ensure against moisture penetration and to provide enhanced stiffness to prevent warping, a metal foil layer may then be affixed to the outside surfaces of the integrated circuit package by epoxy adhesive.

It has been further discovered that lapping or polishing the lower surface of the die element before molding substantially improves the resistance to breakage during the process and, hence, permits utilization of thinner dies and an overall reduction of the package thickness without sacrificing yields. The thinnest die elements used in conventional packaging methods are typically eleven to thirteen (+/−½ mil) mils thick. According to one aspect of the present invention, these standard die elements may be thinned by lapping or polishing the lower surface to permit the use of die elements less than eleven mils thick.

The present invention also provides an improved moisture-barrier for level-one packages. A moisture-barrier layer is applied to the upper and/or lower surface of the casing on the level-one package. The moisture-barrier layer may comprise a dielectric which is applied using a low temperature plasma deposit process. Silicon nitride is suitable for this purpose. Alternatively, the moisture-barrier layer may comprise a thin metal layer deposited on the casing surface using known methods, such as vacuum deposition, sputtering or the like. A metal layer adhered to the casing surface with a low moisture absorption adhesive may also be used.

The moisture-barrier layer is particularly useful in applications involving a die element with casing on its upper and side surfaces, but not on the back surface. Such a package P configuration may result from lapping off the casing on the back side to thin the package P. This configuration may also occur from a molding process designed to achieve this result. The upper surface of the casing of the package may be provided with any of the alternative moisture-barrier layers discussed above. The moisture-barrier layer on the back side surface of the die element preferably should comprise, however, a thin metal layer adhered to the back side surface by a low-moisture high-temperature adhesive.

A further way of providing a thin integrated circuit package having a suitable protective barrier on all surfaces is to first apply a metal layer to the back side surface of a die element by use of a high-temperature; low-moisture adhesive. The integrated circuit die element having the metal layer is then put into a mold and allowed to rest on the bottom surface of the mold cavity. Thereafter, molding compound is applied only above the upper surface of the die and around the side surfaces of the die. To facilitate even dispersion of the molding compound above the die, one or more shallow longitudinal channels may be formed in the interior upper surface of the casing to direct the molding compound during injection. An improved moisture seal can be achieved by providing the metal layer adhered to the bottom of the die with perimeter deformities to increase the effective moisture penetration path to the die element.

The present invention also provides effective methods for minimizing warping of thin (less than 25 mils) packages P. To avoid warpage in a package P comprising an integrated circuit die element having casing only on the upper and side surfaces, a metal layer with adhesive may be applied to the back side surface of the die element and lower surface of the casing of the package P. However, the following is the preferred method for preventing warping in a package P where the integrated circuit die element only has casing on the upper and side surfaces. First, the top surface of the casing is lapped to ensure that the surface is level. Then, a metal layer ribbon is affixed to the upper surface of the casing by adhesive which is then cured. The metal layer ribbon is held in tension while the back side surface of the die element and the lower surface of the casing are lapped to thin the package P. A metal layer is then affixed to the back side surface of the die element and the lower surface of the casing by adhesive which is then cured.

The present invention also includes new and useful embodiments for horizontal level-two packaging. Each integrated circuit die element package or level-one package contained in the horizontal level-two package is constructed by any of the various techniques disclosed herein or as described in patent application Ser. No. 07/561,417. In one embodiment, a level-two package is constructed with vertical columns of leads which extend from the sides of the package. The leads in each vertical column may be sized and formed so as to securably mate with a vertical rail. Each vertically oriented rail is formed of substantially planar material having perimeter edge and two planar, relatively wide surfaces. The leads of each vertical column mate with the edge of the rail. In this arrangement, the wider surfaces of each rail extend outwardly from the stack of level-one packages to form fins which act as heat sinks. These fins are particularly effective at dissipating heat when air is circulated across the fins. Fins can also be provided on the top of the level-two package by extending the rails in an L-shape to overlay a portion of the top of the level-two package.

Other embodiments of horizontal level-two packages which are thin, durable and effective at dissipating heat are also provided. For example, in applications where there is a lack of space above the upper surface of the level-two package, the rail extension may not be used, and instead extensions may be provided across the bottom surface of the package. To make the package as thin as possible and to provide for maximum heat dissipation, the extensions on the bottom surface of the package T are formed such that one of the wide surfaces of the extensions is flush with the bottom surface of the package. The horizontal level-two package is affixed to a circuit board substrate at its bottom surface which includes the rail extensions. The arrangement of having a wide surface of the extensions flush with the bottom surface of the level-two package provides effective heat dissipation by drawing heat from a larger surface area of the package T and conducting it to the circuit board substrate. This type of heat dissipation is desirable where there is inadequate air circulation or insufficient room for providing fins.

An alternative embodiment for providing heat dissipation in these circumstances is to wrap the axis of the level-two package not containing the leads and fins with a highly heat conductive metal saddle. In this embodiment, if rail extensions on the upper surface are used, it is necessary to have the wide surfaces of the rail extensions flush with the upper surface of the package, or to limit the metal saddle to the bottom and end surfaces of the level-two package. The horizontal level-two package having the saddle may be adhered to a circuit board substrate by a layer of thermal filled organic.

Yet another embodiment for high heat dissipation involves the use of multiple level-one packages P comprising a die element with casing on the upper and side surfaces, but not on the back side surface, and a highly conductive metal layer such as copper affixed to the back side surface of the die element and the lower surface of the casing with electrically and thermally conductive adhesive. The metal layer may extend from the sides of the package P. In this embodiment, the metal layer acts as an effective heat spreader for the package, and may also be used as an electrical conductor to provide a ground or voltage plane for example. Multiple level-one packages of this type may be put in a stacked horizontal level-two package arrangement. The level-two package includes a metal layer that wraps around the sides and bottom of the package so as to avoid interference with any leads and/or rails. The ends of the metal layer that extend from the sides of each level-one package may be formed to thermally contact the wrap-around metal layer. Such a package may be adhered to a circuit board substrate by a layer of thermal-filled organic. Suitable thermal filling includes non-electrically conductive materials such as aluminum oxide, aluminum nitride or diamond filler.

As should be appreciated from the above discussion, multiple embodiments of level-one packages and level-two package can be achieved without departing from the spirit of the invention.

BRIEF DESCRIPTION OF THE DRAWINGS

The above and other objects, features and methods of the invention will be apparent to one familiar with the art from the description of the preferred embodiment of the invention with reference to the accompanying drawings in which:

FIG. 6 is a partial cross-sectional view of an integrated circuit die element positioned in a mold in accordance with the present invention;

FIG. 17 is an isometric view of one embodiment of a horizontal level-two package according to the present invention;

FIG. 20 is a side view of a horizontal level-two package attached to a circuit board substrate in accordance with the present invention;

FIG. 24 is a side view of an alternative embodiment of a horizontal level-two package, which is attached to a circuit board substrate, in accordance with the present invention;

DETAILED DESCRIPTION OF THE PREFERRED EMBODIMENTS

A better understanding of the present invention can be had when the following detailed description is read with reference to the drawings wherein common elements are designated with like numbers or letters. The invention disclosed in U.S. Pat. No. 5,279,029, by Burns, which is incorporated herein by reference, provides an integrated circuit packaging method which enables level-one elements to be packaged in transfer molded casing approximately 7 mils or less thick, encompassing an integrated circuit die element approximately eight to sixteen mils thick to produce a reliable level-one package less than thirty-two mils thick. As disclosed in the parent application, these level-one units may then be bound together mechanically or using an epoxy adhesive approximately one mil thick, with the outer surfaces of the outside level-one units having a vapor barrier such as a thin metal layer adhered thereto or deposited using known semiconductor manufacturing methods such as vacuum deposition, sputtering or the like and adhesive lamination. Throughout this application where it is necessary to adhere a thin film to a substrate or surface of a level-one package, the preferred adhesive materials are high-temperature, moisture resistant materials such as polyimide 111-15 from Creative Materials, Inc., thin free-base film x1-5000 available from Ablestik Laboratories, or XK/5022-81C from Epoxy Technology, Incorporated.

Figure 1:
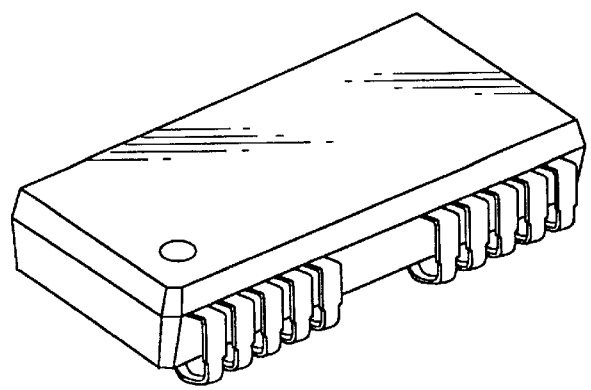
FIGS. 1–4, and 5a–5c illustrate prior art packaging for integrated circuits.
Figure 2:
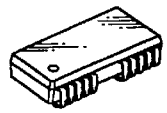
Figure 3:
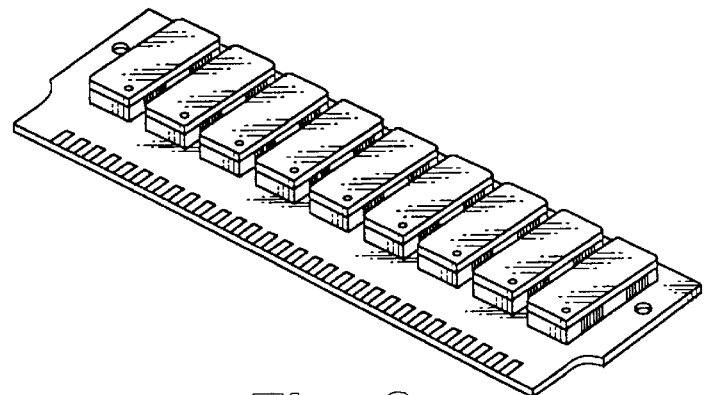
Figure 4:
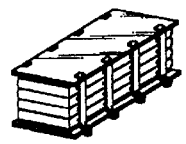

This packaging technique provides a high density module or level-two package with improved moisture resistance. The lamination of multiple level-one elements together can provide adequate structural rigidity to prevent intolerable flexing of the internal integrated circuit elements when the packages are ultra-thin, and can also provide alternate methods of moisture-resistance and negate the need for the metal vapor barrier between the packages. Using the packaging technique of the present invention, ultra-dense reliable packages such as the nine megabyte DRAM shown at approximate actual size in FIG. 4 can be achieved.

Figure 5A:
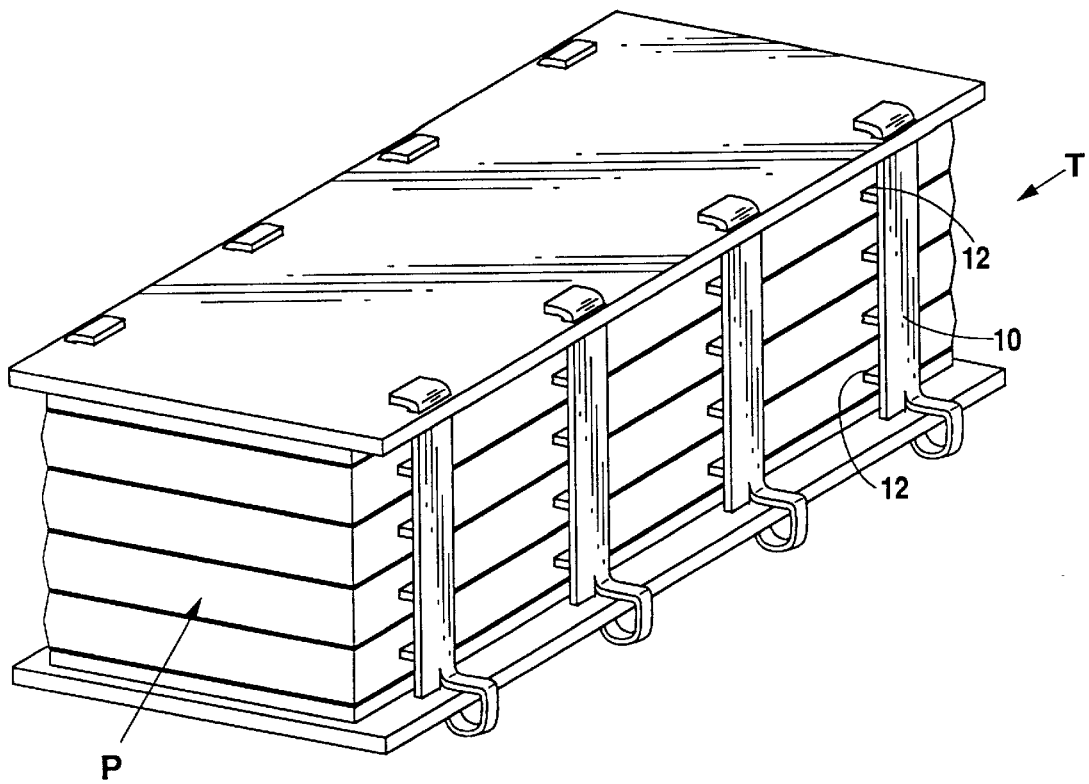
Figure 5B:
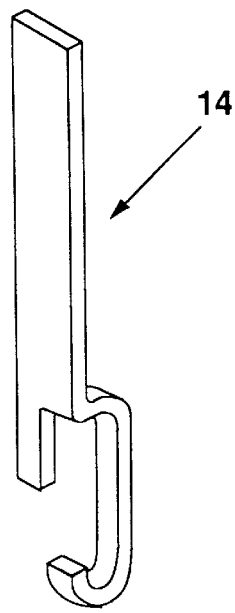
Figure 5C:
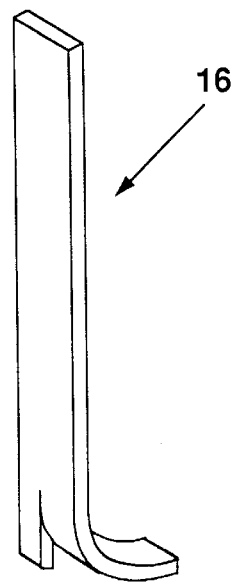

U.S. Pat. No. 5,279,029 provides a horizontally stacked module embodiment which utilizes level-one packages P laminated together in a horizontal module or level-two package T. In this embodiment, illustrated in FIG. 5a, electrical interconnection and thermal conduction are provided by a rail assembly, or an array of vertically oriented conductive rails 10 aligned with the vertical columns of leads 12, and extending- from the top to the bottom of the stack. These rails can be configured with SMT J-leads 14 (FIG. 5b) or gull-wing leads 16 (FIG. 5c) for the package. Significant advantages are realized by incorporating an electrical signal bus and integral heat-sink in the vertical rails 10 which also provide structural integrity for the horizontal module.

A unique feature of the horizontally oriented level-two module or package T is the relatively large cross-sectional area of the rails 10 connecting the leads 12 of the level-one packages P. These rails 10 act as excellent low impedance buses for both electrical current flow and thermal heat transfer. The low electrical impedance provides for less ground bounce, less signal distortion, and improved signal integrity. The low thermal resistance allows for improved heat transfer from the die interior, which provides increased reliability and longer operating life for some embodiments, and in ultra-high density embodiments provides a package that can be adequately heat compensated with conventional convection techniques.

This continuation-in-part application provides new and useful embodiments of thin, yet durable and reliable level-one packages and horizontal level-two packages.

Level-One Packages.

As disclosed in U.S. Pat. No. 5,279,029, a thin transfer molded casing is used to package an integrated circuit die element, including an integrated circuit formed on a semiconductor substrate. Since one of the goals of this invention is to achieve thin yet durable and reliable integrated circuit packaging, it is important that the molded casing be made as thin as possible without breaking, warping or destroying the integrity of the integrated circuit package. It has been discovered that one effective way to achieve a thin and durable integrated circuit die element package is to ensure that the integrated circuit die element, which is formed on a semiconductor substrate, maintains a position parallel to and above the horizontal lower surface of the mold during the molding process. Positioning the integrated circuit die element parallel to and above the lower surface of the mold ensures that when the molding compound is transferred into the mold, it will distribute somewhat evenly around the entire surface of the integrated circuit die element. If the integrated circuit die element is not held in position, one side of the die element will have a thicker coating of molded casing than is necessary while the other side may have too thin a layer of casing. The molded casing may have to be applied thicker than necessary to ensure that there are no thin areas. Regardless, the application of uneven molded casing may cause warping of the integrated circuit package if the silicon die is 14 mils or thinner.

FIG. 6 illustrates an integrated circuit die element 22 held in a position parallel to the lower surface 26 of a mold 28 by pins 30. The cross-section of lead frame 21 attached to die element 22 is also schematically illustrated. Mold 28 is generally of the type conventionally used in encapsulating integrated circuit die elements modified so as to provide the enhanced characteristics described below. As illustrated in the cross-sectional view of FIG. 6, mold 28 comprises: an upper molding plate 23 and a lower molding plate 25; a runner 27 and gate 32 through which the molding compound flows; and an air vent 29. Gate 32, the opening into the mold cavity 31 into which the molding compound is transferred, is formed to direct molding compound to enter the mold cavity from a position above the die due to the shape of cavity 31. As a result, the molding compound is applied in a slightly larger thickness above the upper surface 34 of the die element 22. Inputting the molding compound from the gate on the top and applying the molding compound thicker above the upper surface 34 creates more fluid pressure above than below the die, thereby holding the die element 22 in its proper position on top of pins 30.

Pins 30 are formed integrally with molding plate 25 and are positioned to provide uniform vertical support for die 22. A sufficient number of pins 30 must be used to prevent damage caused by warping or breakage of the die element 22 by the differential pressure on the upper and lower surfaces caused by the molding compound. The number of pins 30 required is dependent on the thickness and rigidity of the die 22, the amount of fluid pressure exerted on the die during molding, and the tolerance to warping exhibited by the particular circuit. Determination of spacing for pins 30 can therefore vary from one application to another. Suitable pins are approximately five mils in height, twenty-five mils in diameter with 30° to 45° draft. For comparison, the integrated circuit die element is typically approximately eight to twenty-one mils thick. In one application, pins 30 were evenly spaced on 158 mil centers to support die as thin as 8.7 mil. To facilitate compound flow over the length of the die, longitudinal channels (not shown) may be formed in the portion of the surface of plate 23 overlaying the die element 22.

Figure 7A:
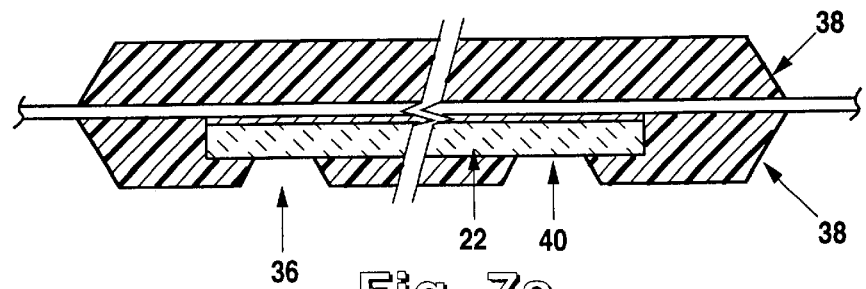
FIGS. 7a–7e are cross-sectional views of an integrated circuit die element after the molding process and after subsequent processing steps are performed in accordance with the present invention.
Figure 7B:
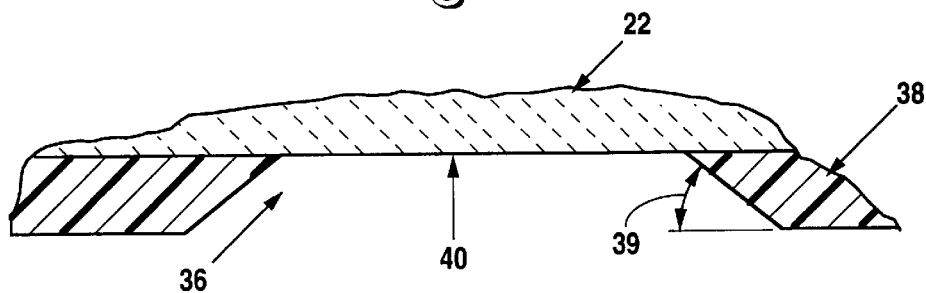
Figure 7C:
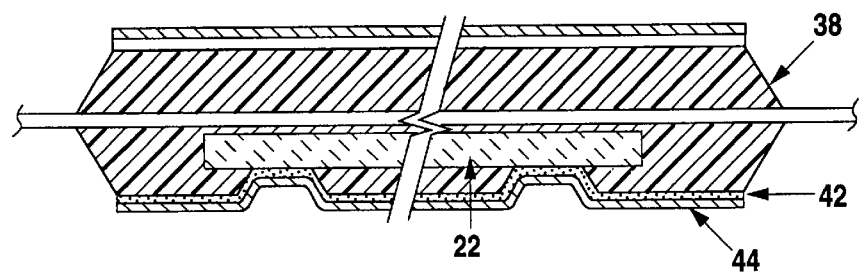
Figure 7D:
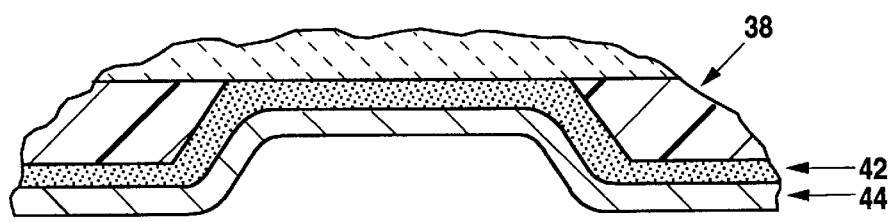

After the molding compound is applied to the proper thickness, it is set up and becomes hardened casing 38, and the integrated circuit die element 22 having casing is removed from the mold. Pin holes or cavities 36 will be left in the casing 38, as illustrated in FIG. 7a and the close-up of FIG. 7b. It is to be noted that the drawings are not intended to indicate true relative dimensions but are merely for illustrative purposes only. The pin cavities 36 leave exposed areas 40 on the integrated circuit die element 22. In one embodiment disclosed in U.S. Pat. No. 5,279,029, an epoxy layer is applied over the surfaces of the casing 38 and then an outer metal foil layer is applied over the epoxy. It has been discovered that the integrity of an integrated circuit package can be maintained even with pin cavities 36 in the casing 38 if epoxy adhesive 42 is applied to the casing 38 and the exposed areas 40 resulting from the pin cavities 36, and then a outer metal foil layer 44 is applied over the epoxy adhesive. FIGS. 7c and 7d. The metal foil layer 44 must be applied thick enough and must be ductile enough to form into the pin cavities 36 without rupturing the metal foil layer and deteriorating the vapor seal created by the epoxy adhesive 42. It is preferred that the walls of the pin cavities be formed so that angle 39 (FIG. 7b) is in the range of 30° to 45° to ensure that the metal foil layer 44 is properly formed. The proper wall angle is achieved by using pins formed or shaped to the appropriate wall angle as illustrated in FIG. 6 and described above.

Figure 7E:
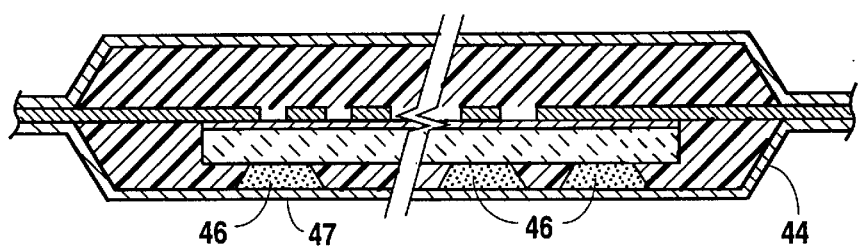

Referring now to FIG. 7e, an alternative embodiment wherein pin cavities 36 are filled entirely with an epoxy 46 is illustrated. In this embodiment, cavities 36 are first filled with a suitable epoxy 46. Surface 47 is finished either by smoothing the excess uncured epoxy immediately after pouring, or lapping it off after curing. A metal foil layer 44 can then be affixed to the outside surface of the integrated circuit package by epoxy adhesive 42.

An alternative technique for positioning the die during molding is to use retractable pins. With this technique, the pins are in the up position when the molding compound beings to enter the mold. After a period of time sufficient to allow some stiffening but while the molding compound is still somewhat fluid and not fully set up, the pins are retracted to the down position. The pressure of the molding compound forces the pin cavities to be filled without significant movement in the position of the integrated circuit.

Another option for maintaining the integrated circuit die element in position is to provide retractable pins that contact the integrated circuit die element on the upper rather than the lower surface. In this regard, it should be noted that while this description of the preferred embodiment has described the process as providing excess pressure above the die and support pins below the die, much the same result can be achieved by providing supporting pins above the die and flowing more compound below the die. Care must be exercised when supporting the upper surface of the die to avoid damage to the lead frame and bonding contacts. In addition, pins can be provided on both the upper and lower surfaces to ensure maximum securing of the integrated circuit die element with enough opening so as not to damage the die and lead frame.

Figure 8A:
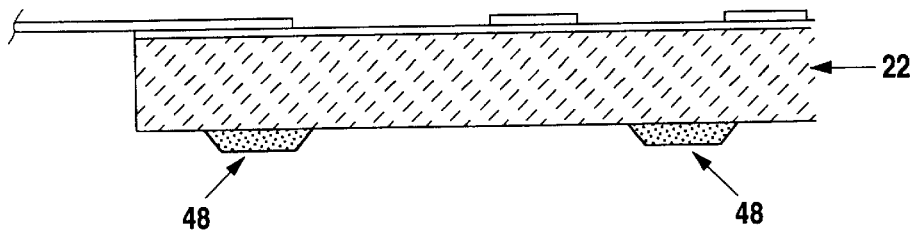
FIGS. 8a–8c relate to an alternative molding process for an integrated circuit die element.
Figure 8B:
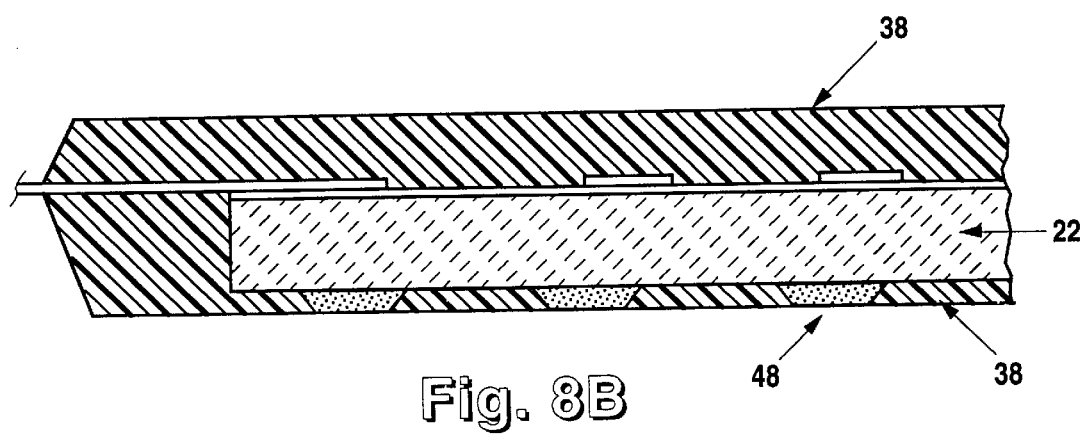
Figure 8C:
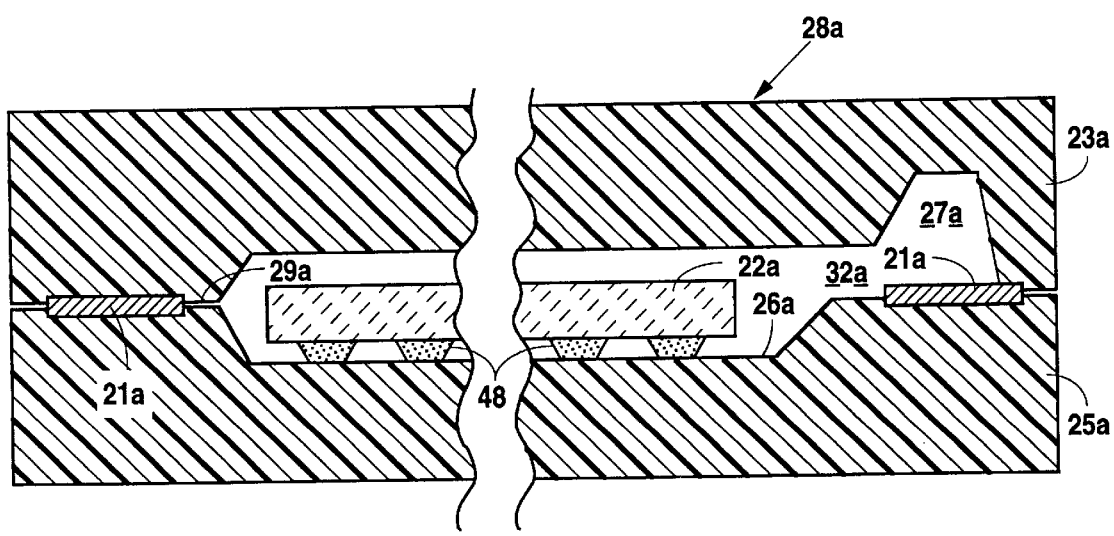

Yet another alternative embodiment for positioning the integrated circuit die element 22 is to provide the die element itself with epoxy supports which serve the same function as the pins 36 described above. FIG. 8a illustrates epoxy supports 48 attached to the lower surface of an integrated circuit die 22. Epoxy supports 48 can be placed on the lower surface, the upper surface or both surfaces. Supports 48 are generally formed as truncated cones of high temperature epoxy on the surface(s) of die 22 using an appropriate mold. After supports 48 have been formed and set, die 22 is placed in mold 25a (FIG. 8c) and the transfer molding process is performed as described above. In FIG. 8c, like numerals designate like elements and functions with regard to the molding process described above referencing FIG. 6. FIG. 8b illustrates integrated circuit die 22 with epoxy supports 48 after the molding process has formed casing 38.

Another method for providing integrated circuit die element 22 with the epoxy supports 48 is to position circuit die element 22 upside down and then apply epoxy drops to the lower surface of the die element 22. The epoxy drops will have an uneven surface when applied. A flat, non-stick plate may be used to flatten the epoxy drops so that the epoxy surface is flat and the epoxy has a uniform thickness. The epoxy is then cured. Suitable epoxy supports will be approximately five mils thick. The integrated circuit die element 22 with the epoxy supports 48 is then molded with the molding compound in the manner described above.

Figure 9:
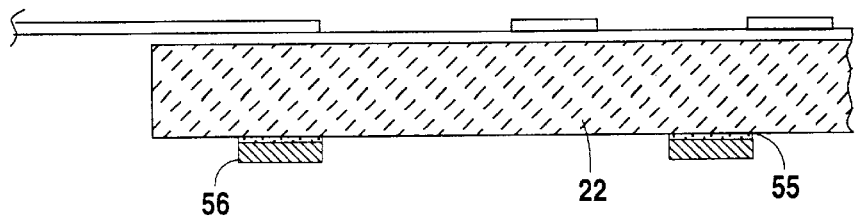
FIG. 9 is an alternative method for preparing the integrated circuit die element for a molding process.

An alternative embodiment for the integrated circuit die element supports is disclosed in FIG. 9. In this embodiment, dots formed of material 56 having a thickness of about 4.5 mils and having a length and width (not shown) of about twenty-five mils are affixed to the upper, the lower or both upper and lower surfaces of the die element 22 with a ½ mil thick adhesive 55. Copper, for example, may be used for the material 56.

It has been further discovered that polishing the lower surface of the die element 22 before molding substantially improves the resistance to breakage during the process and hence permits utilization of thinner dies and an overall reduction of the package thickness without sacrificing yields. Standard die elements are approximately nineteen mils thick and are rigid. It has been the general belief by those skilled in the art that if the die element is made too thin, it may lose strength and break. In fact, the thinnest die elements used in conventional packaging methods are typically eleven to thirteen (+/−½ mil) mils thick. However, it has been discovered that if the die element is made thinner, then it actually becomes flexible and is thus less prone to breakage. Die elements having a thickness as little as three mils are desirable provided no substantial yield losses are incurred.

Applicant has discovered that if one begins with a standard die element in the range of eleven to thirteen mils thick which is thinned by lapping the back or lower surface, the resulting thin die is more durable and breakage resistant than a die formed at the target thickness originally. For this purpose, a conventional lapping or grinding machine with appropriate thickness control stops may be used to provide for lapping or grinding at the back side surface until the desired thickness is achieved.

Figure 10A:
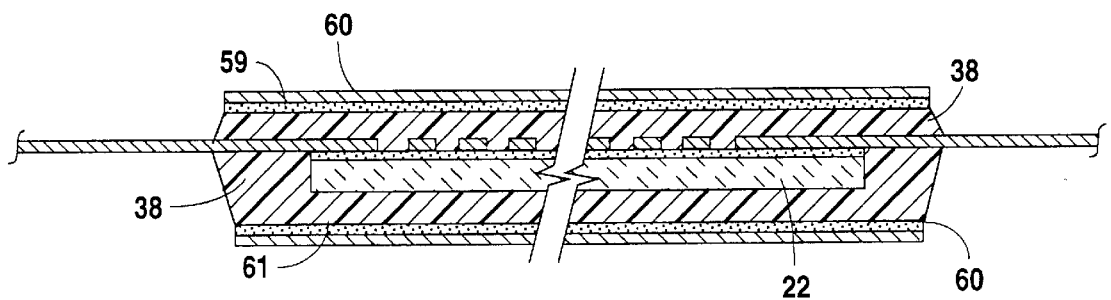
FIGS. 10a–10g relate to alternative embodiments of moisture-resistant packaging of an integrated circuit die element.
Figure 10B:
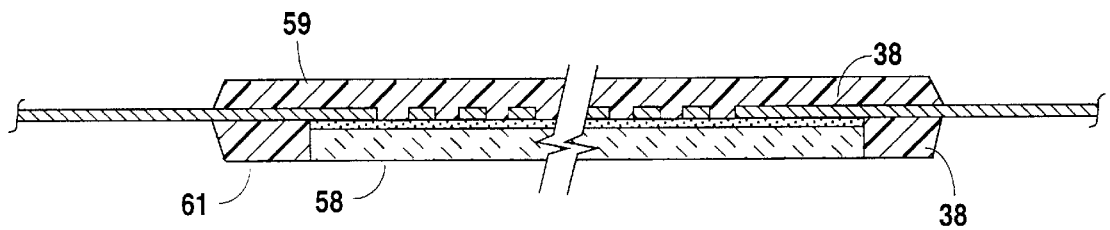
Figure 10C:
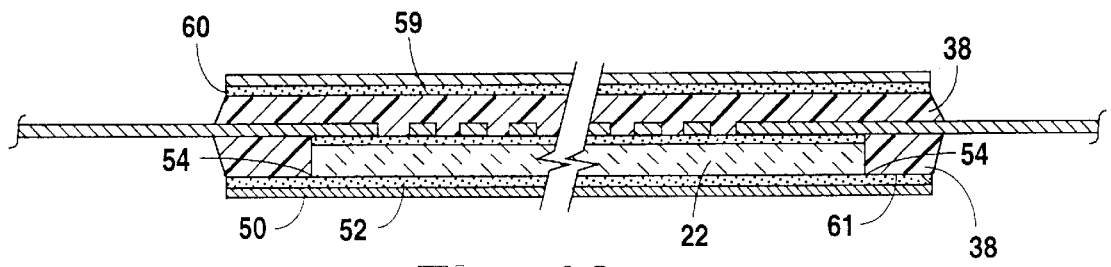

The present invention also provides an improved moisture barrier for level-one packages. Moisture resistance is necessary to ensure reliability and to avoid rupture of the casing covering the die-element, also known as pop-corning. Pop-corning can occur when the casing has absorbed moisture and the casing becomes heated during a surface mount reflow process. FIGS. 10a–10c illustrate various embodiments of moisture resistant packages which will be discussed.

FIG. 10a illustrates a die element 22 with a completely surrounding casing 38 and a moisture-barrier layer 60 on both the upper 59 and lower 61 surfaces of the casing. Alternatively, the moisture-barrier layer may be only on the upper surface or the lower surface.

Moisture-barrier layer 60 may comprise a layer of silicon nitride or a similar dielectric which is first applied to the upper 59 and/or lower 61 surface of casing 38 using a low temperature plasma deposit process. Alternatively, moisture-barrier layer 60 may comprise a thin metal layer deposited on the casing surface using known methods such as vacuum deposition, sputtering or the like. This technique cannot be used, however, if there are unfilled pin holes or cavities in the casing, such as illustrated in FIGS. 7a–7b, because the deposited metal may cause shorting of any exposed die element lead frame. A metal layer adhered to the upper 59 and/or lower surface 61 of casing 38 with a low moisture absorption adhesive may also be used to provide moisture-barrier layer 60. For example, a 0.6 mil copper metal layer may be applied to the casing using 0.4 mil of low moisture absorption adhesive. Stainless steel may be used in those applications where its relative low conductivity is not a problem.

FIG. 10b illustrates a die element 22 with casing 38 on its upper and side surfaces but not on the lower surface 58. Such a configuration may result from lapping off the casing on the lower surface to thin the package P. Note that package P may also be thinned by lapping off some of the casing 38 on the upper surface of the die element 22. The configuration of FIG. 10b may also occur from a molding process designed to achieve this result. A molding process that would achieve this result would involve placing a die element 22 in a mold cavity 31, such as discussed with regard to FIG. 6, and not using pins or supports but rather allowing the die element to rest on the lower surface 26 of the mold cavity. Molding compound would be applied on the upper surface of the die element 22 and would, through fluid pressure, keep the die element on the lower surface 26 such that casing would only be applied to the upper and side surfaces.

Regardless of how the configuration of FIG. 10b is achieved, the die element package should be provided with a moisture barrier. The upper surface 59 of casing 38 may be provided with any of the alternative moisture-barrier layers 60 as discussed above. The moisture-barrier layer 60 on the lower surface 58 of the die element and the lower surface of the casing 61 preferably should comprise, however, a thin metal layer 50 adhered to the back side surface and casing by low-moisture adhesive 52. FIG. 10c. If deposited metal or a dielectric is used on the surface 58, cracking at the casing to die element interface 54 may occur.

When an integrated circuit package P is to be used in a horizontal level two package T of multiple packages P laminated together, providing each package P with outer moisture-barrier layers 60 may not be necessary. The packages P may be adhered to one another by an epoxy bond layer with only the uppermost and lowermost surfaces of the entire package T being provided a moisture-barrier layer 60.

Figure 10D:
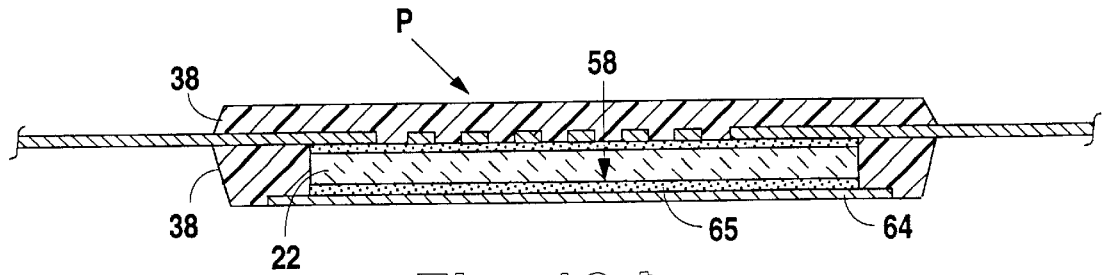
Figure 10E:
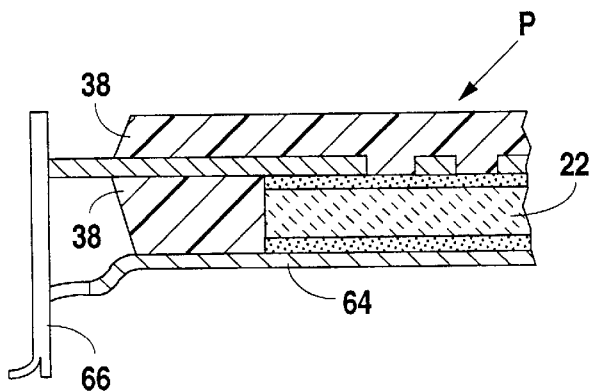

A further way of providing a thin integrated circuit package having a suitable protective barrier on all surfaces is to first apply a metal layer 64 to the surface 58 of a die element 22 by use of an adhesive 65. See FIG. 10d. Suitable metals for the layer 64 include Kovar, aluminum, copper (110), and beryllium copper. Stainless steel is suitable for applications where thermal conductivity is not a primary requirement. The integrated circuit die element 22 having metal layer 64 is then put into a mold such as described with reference to FIG. 6 except that no pins or supports are used to support the die element and layer 64 rests on the lower surface 26 of the mold cavity 31. Thereafter, molding compound is applied only above the upper surface of die 22 and around side surfaces of die 22 to form casing 38 as depicted in FIG. 10d. If desired, the metal layer 64 may be formed to extend outwardly from the sides of package P so that it can be connected to a rail 66, for example, and act as a heat sink as similarly described in U.S. Pat. No. 5,279,029. See FIG. 10e.

Figure 10F:
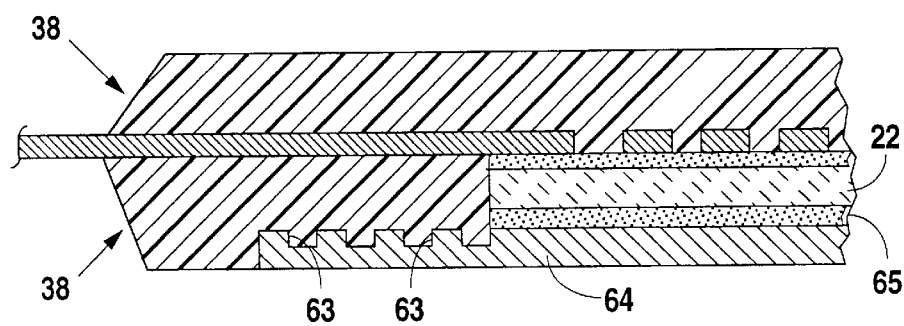
Figure 10G:
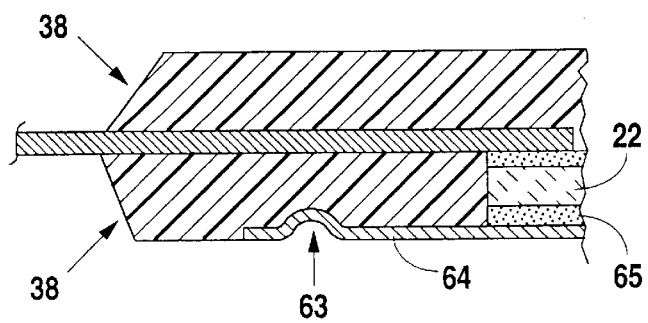

FIGS. 10f and g illustrate an embodiment wherein an improved moisture seal is achieved by providing metal layer 64 with deformities 63 to increase the effective moisture penetration path to die 22. These deformities 63 may be formed by a machining process, etching, abrading, or applying a chemical treatment, for example. The deformities 63 provide for better mating or seating of the molded casing compound 38 with the metal layer 63, and create a longer path of travel and thus a more effective resistance to moisture penetration from the surface where the molding casing 38 and metal layer 64 mate.

In normal packages P where the casing is twenty-five to seventy-five mils thick on the top and bottom of the integrated circuit die element, the moisture penetration path is predominately along the lead frame/casing interface. However, if the casing is very thin, for example ten mils or less for a TSOP package, moisture can penetrate directly through this thin casing. Commonly available improved moisture resistant molding compounds may be used to reduce moisture penetration in applications where such thin casing is used. It is anticipated that the moisture-resistant molding compound may reduce moisture penetration to such a degree that the moisture-barrier layers discussed above may not be necessary, even if the casing is less than ten mils. However, the use of moisture-barrier layers with the moisture resistant compound should provide the best results against moisture penetration in thin level-one packages.

An additional consideration when fabricating thin integrated circuit packages P is warping. For example, because the molding compound applied to the die element may shrink when it is cured, if there is no casing on the lower die surface, such as is discussed with reference to FIG. 10b, negligible warping of package P may occur. More significant warping may occur if the lower surface of the die element has been lapped to thin the die element. Warping is of particular concern for the uppermost package P in a horizontal level-two package T. Warping in the other packages P of horizontal level-two packages T may be eliminated by the sandwiching of the packages P in the level-two laminate.

Figure 11A:
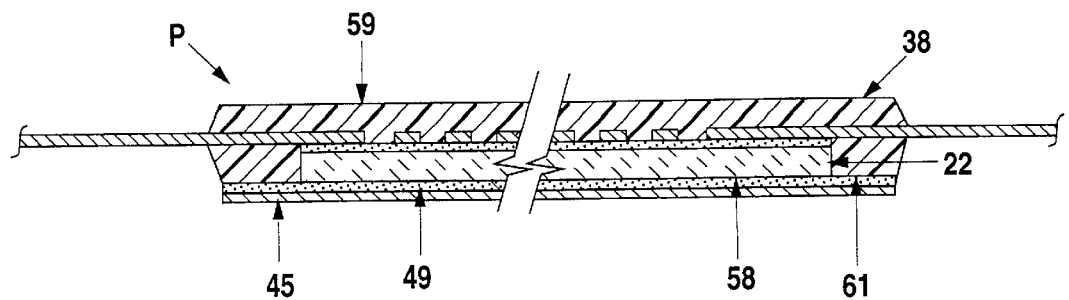
FIGS. 11a–11c refer to alternative embodiments of packaging an integrated circuit die element so as to prevent warping.

The following methods are effective at preventing warping of thin (less than 25 mils) packages P. One method involves applying a metal layer 45 with adhesive 49 to the lower surface 58 of the die element 22 and lower surface 61 of casing 38 of the package P. See FIG. 11a As an example, 0.6 mil stainless steel may be affixed with 0.4 mil adhesive to the die element. The metal layer 45 may also be applied to the upper surface 59 of the casing 38, but having the metal layer on the upper surface is not as effective at preventing warpage as is having the metal layer on the bottom surface. Using the above-method to prevent warpage, integrated circuit packages P at least at thin as twelve mils but having structural strength of much thicker packages may be achieved.

Figure 11B:
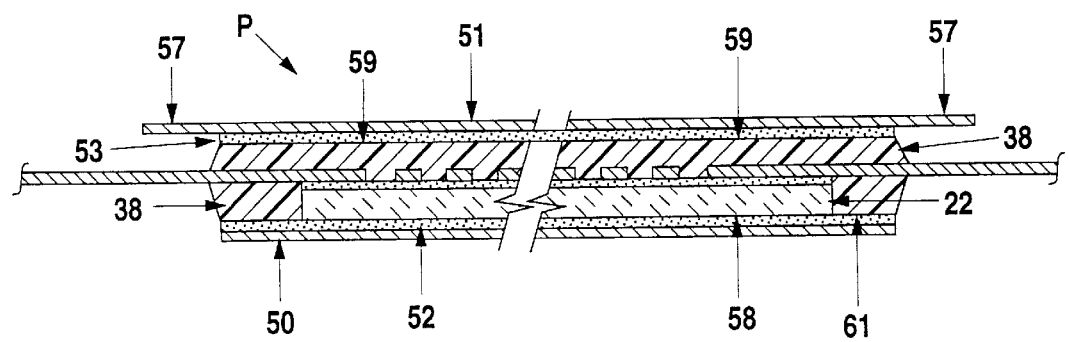
Figure 11C:
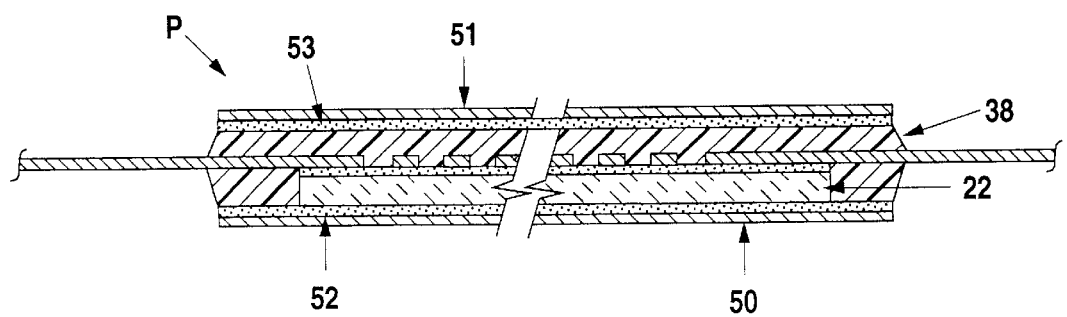

The preferred embodiment for preventing warpage is illustrated in FIGS. 11b and c. Starting with a die element 22, fourteen mils for example, having casing 38 on its upper and side surfaces, the top surface 59 of casing 38 is lapped to ensure that the surface is level. A metal layer ribbon 51 is affixed to the upper surface 59 of the casing 38 by adhesive 53 which is then cured. See FIG. 11b. The metal layer ribbon 51 is held in tension at sections 57 of the ribbon which extend beyond the side of package P. The lower surface 58 of die element 22 and the lower surface 61 of casing 38 are then lapped to thin the package P. A fourteen mil die may be thinned to three to twelve mils. A metal layer 50 is then affixed to the lower surface 58 and the lower surface 61 by adhesive 52 which is then cured. Any excess metal ribbon 57 extending from the sides of package P is trimmed off. See FIG. 11c.

Horizontal Level-Two Packaging

Figure 12A:
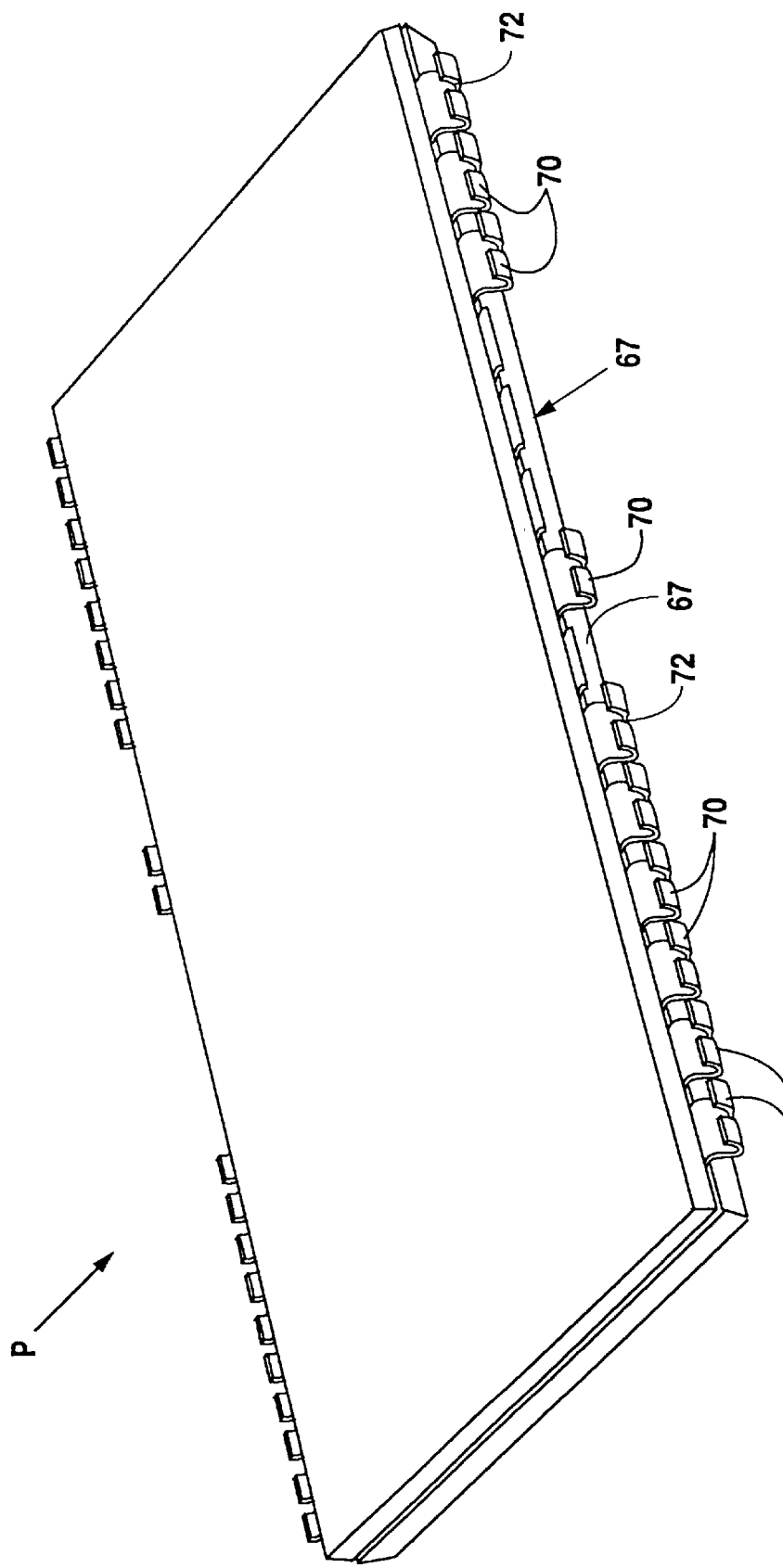
FIGS. 12a and 12b are isometric views of alternative embodiments of level-one packages according to the present invention adapted with leads having slots which mate with rails.

The present invention also includes new and useful embodiments for horizontal level-two packaging. FIG. 12a illustrates a level-one package P having uniquely shaped leads 70 used in a new and useful horizontal level-two package. The level-one package is constructed by any of the various techniques disclosed above or as described in U.S. Pat. No. 5,279,029. The leads 70 of package P in this embodiment, in comparison to the leads disclosed in U.S. Pat. No. 5,279,029, are formed into a u-shape and have a slot 72 formed at the end of the lead 70 furthermost from the package P. As will be further discussed below, leads 70 are sized and formed so as to securely mate with a rail.

Figure 12B:
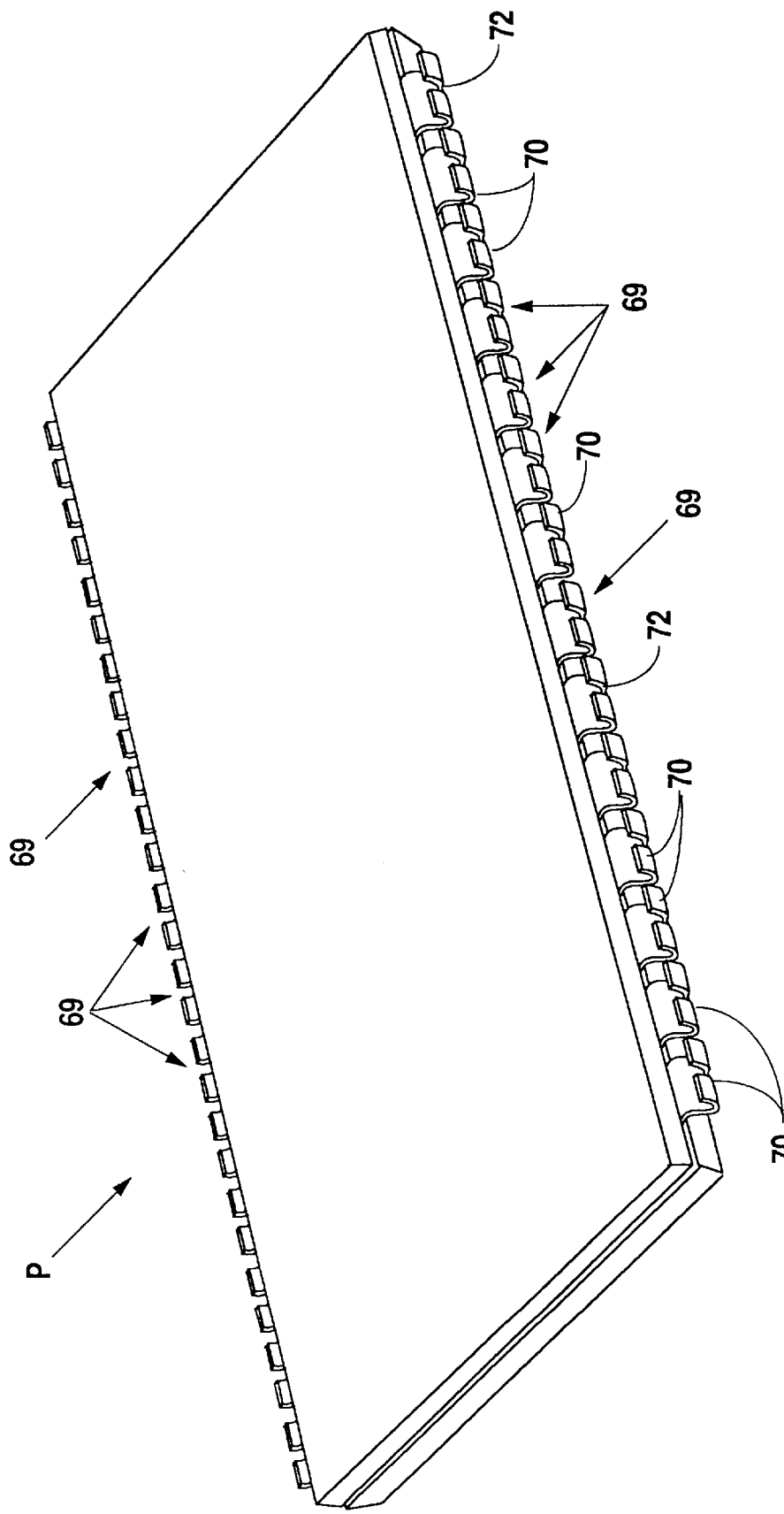

In building a modular level two package comprised of a plurality of stacked level one packages it is frequently desirable to selectively disconnect one or more leads 70 from the level two package rails. In this way, all level one packages are initially configured with identical lead arrays, some of which are selectively removed during assembly of the level two package. In FIG. 12a, the unused leads are cut off and are not part of package P. The cut-off points are indicated by reference numeral 67. However, in the embodiment illustrated in FIG. 12b, the unused leads 69 still extend from the sides of package P. The unused leads are instead disconnected internally in package P by etching away the connections on the die element 22. Die element 22 is formed on a semiconductor substrate. Extending the unused leads from the side of the package P is believed to be preferable because the unused leads then act as additional heat transfer elements.

Figure 13:
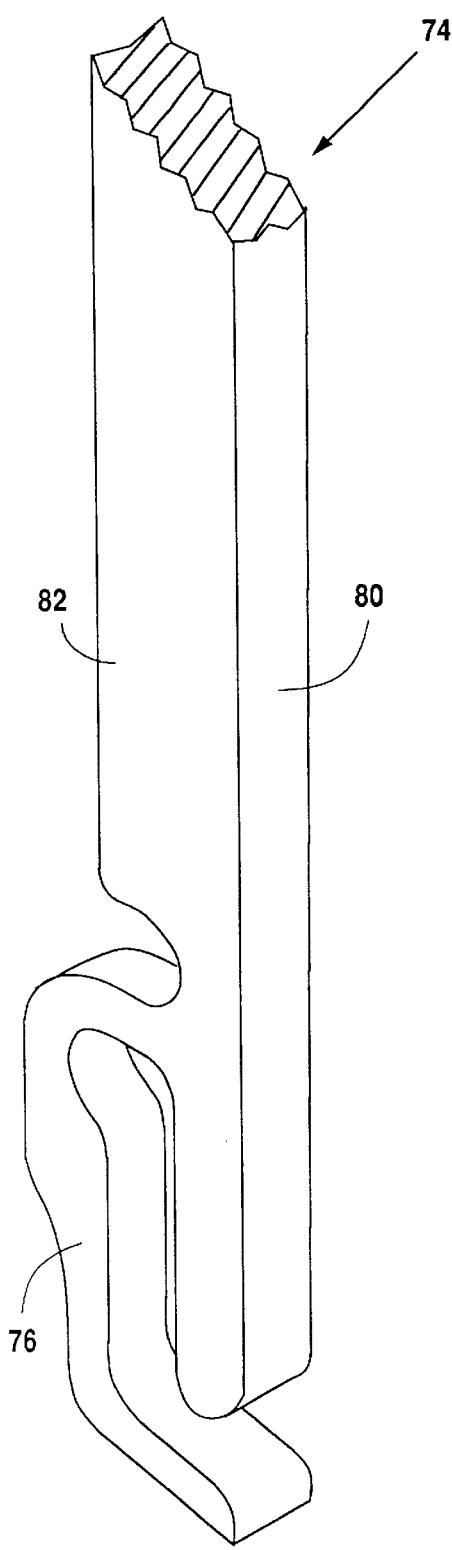
FIG. 13 is an enlarged isometric view of a portion of a rail used in a horizonal level-two package according to the present invention.
Figure 15:
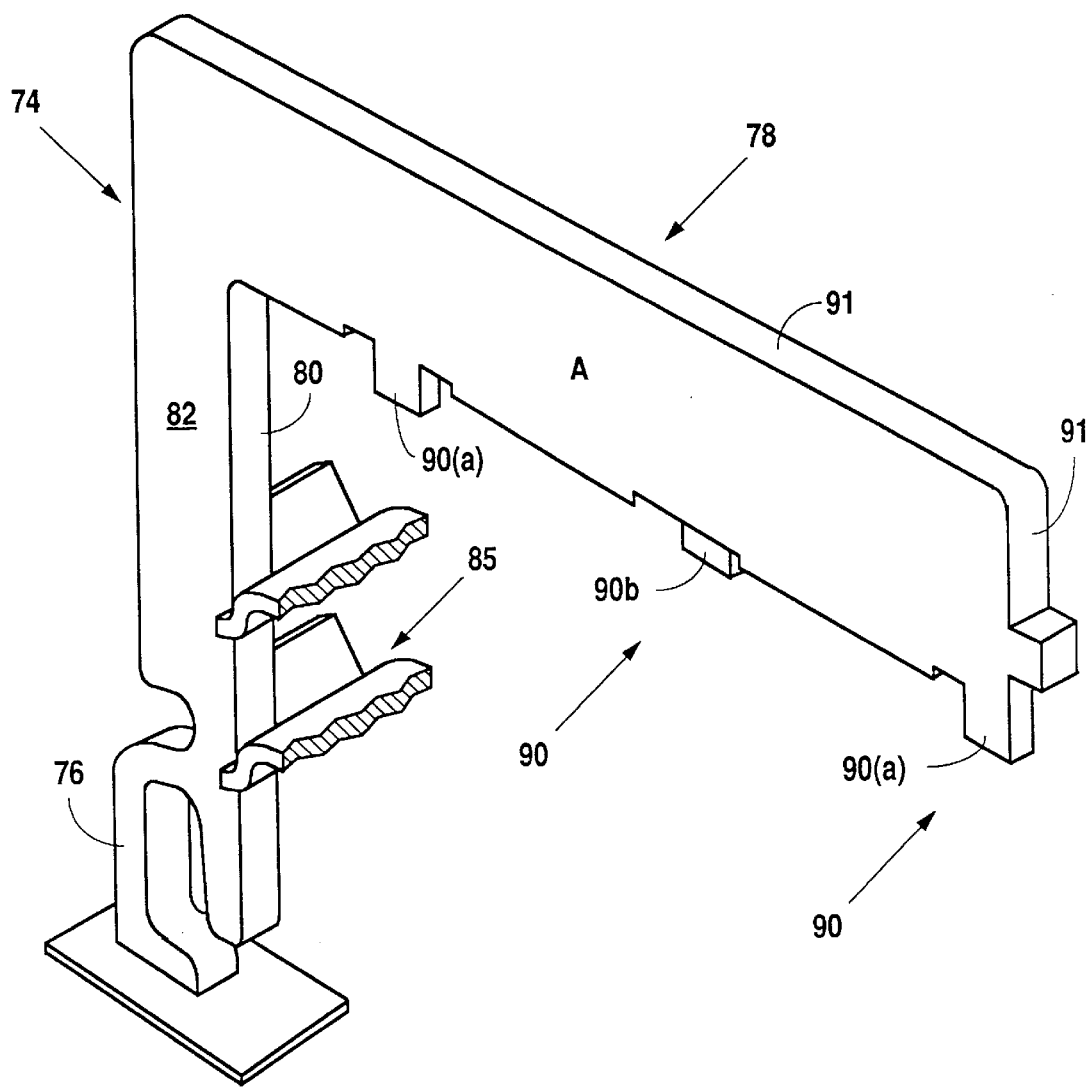
FIG. 15 is an enlarged isometric view of a rail having an extension and tabs and wherein leads are coupled to the rail in an alternative embodiment of a level-two package of the present invention.

FIG. 13 illustrates the preferred embodiment of rail 74 to be used in the level-two packaging arrangement disclosed herein. Rails 74 include a circuit board mounting portion 76 configured in a J-lead configuration. The preferred material for rails 74 is beryllium copper alloy C3 having a cross-sectional thickness of 0.008 inches. Full hard or hard copper alloys (110 or 197) are preferable as is olin copper alloy 1094. As illustrated in FIGS. 15 and 17, rails 74 are optionally provided with extensions 78 which will be explained in more detail below.

FIG. 17 illustrates rails 74 installed in a horizontal level-two package arrangement. Level-one packages P are assembled into a level-two package T by any of the methods described in U.S. Pat. No. 5,279,029. For example, the individual packages P are either mechanically bound together by the structural members of package T or, alternatively, each level-one package is adhered to the package immediately above and below with epoxy adhesive, with only the uppermost and lowermost level-one packages provided with an outer metal foil layer attached to the outside surfaces by an adhesive epoxy. A top member, or cap 79, may be provided at the top surface of the preferred horizontal level-two package. Cap 79 may be applied to the surface with adhesive, or alternatively may be nested into a recess formed in the surface during holding.

Figure 14:
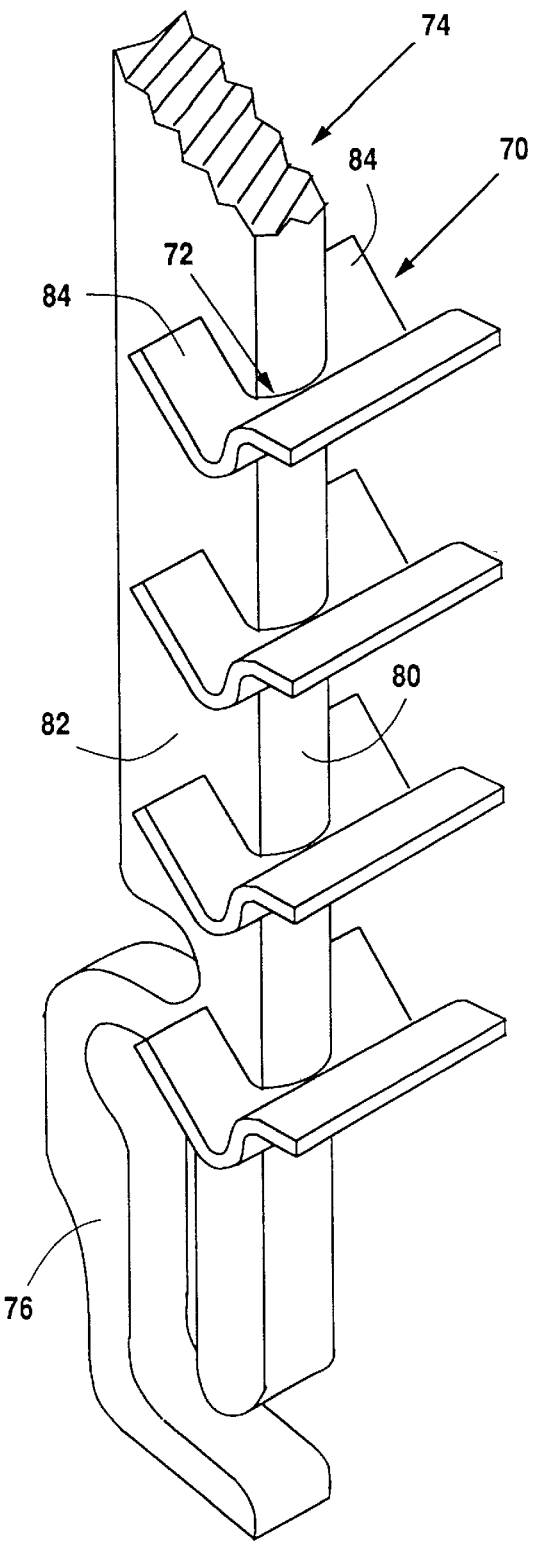
FIG. 14 is an enlarged isometric view of a portion of a rail and leads coupled to the rail in accordance with one embodiment of a level-two package of the present invention.

FIG. 14 illustrates how rails 74 connect with leads 70. In the preferred embodiment, the rails 74 are vertically oriented having an edge 80 which is thinner than side 82. The edge 80 is adapted to be received in slot 72 formed in leads 70. In the embodiment illustrated in FIG. 14, the edge 80 of rail 74 is inserted into and mated with each slot 72 of leads 70 in the same vertical column, with fingers 84 of the leads grasping the wide side 82 of the rail. In this structural arrangement, rails 74 are securably coupled with leads 70. The leads 70 are then soldered to the rails 74 using a suitable high-temperature solder. The structural arrangement between the lead and rails in this embodiment has heat dissipation advantages as will be disclosed below.

Figure 16A:
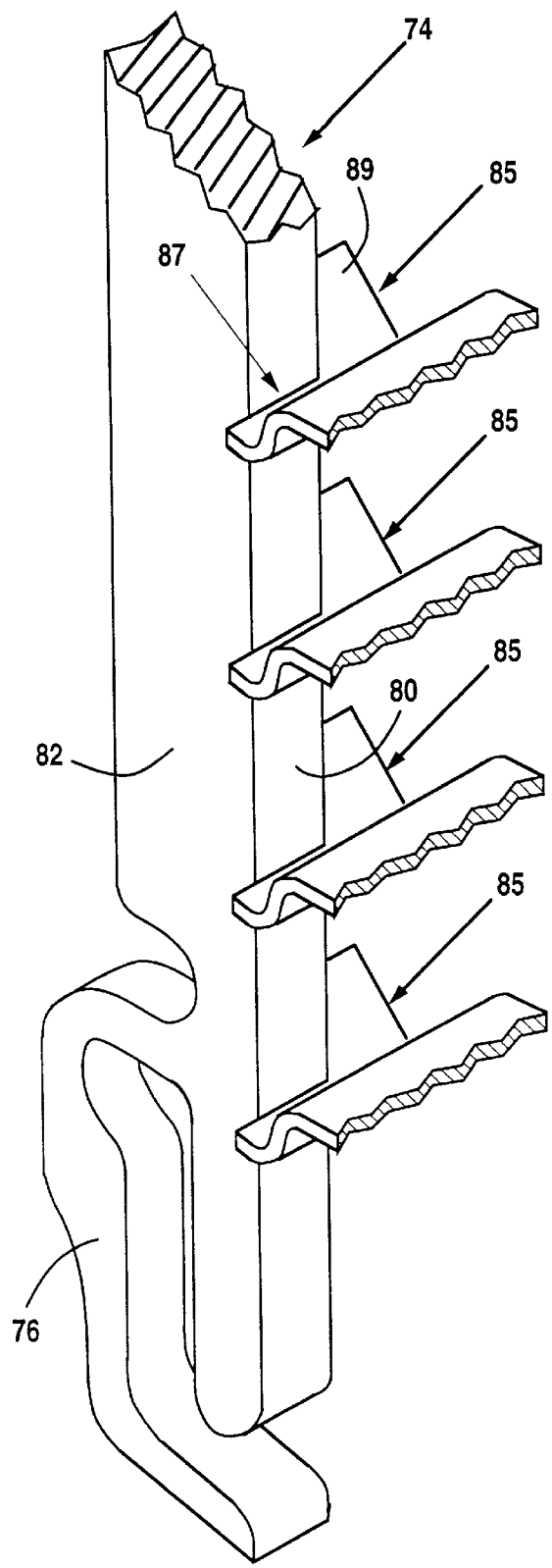
FIG. 16a is an enlarged isometric view of a portion of a rail and leads coupled to the rail in an alternative embodiment of a level-two package of the present invention.

FIG. 16a illustrates leads 85 having L-shaped ends, rather than the u-shaped ends as disclosed in the above embodiment, coupled with rails 74. As in the embodiment disclosed above, edges 80 of rails 74 couple with the leads. The ends of leads 85 are formed with a slot 87 and a single wide finger 89. The slot 87 contacts edge 80 of the rails 74 while the finger 89 contacts the wide side 82. The L-shaped leads 85 are believed to be preferable to the u-shaped leads because the wide finger portion 89 of the L-shaped leads 85 provides a larger surface area for soldering. Such a large surface area is preferable because the soldering placement and size does not have to be as precise as when there is a smaller surface area. Such flexibility in the precision is important when the soldering is done by an automation procedure.

Figure 16B:
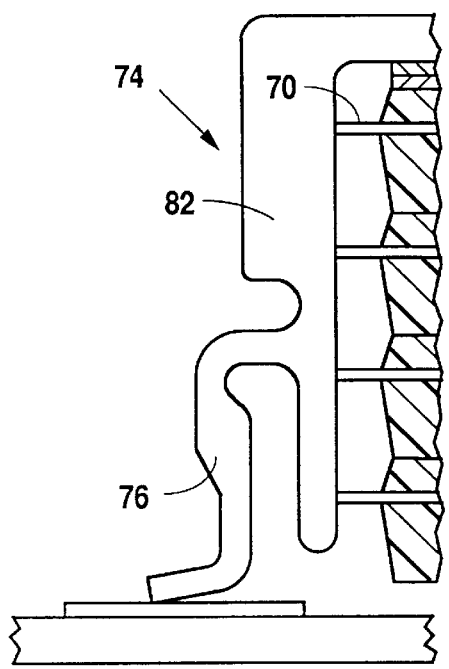
FIGS. 16b–d are side views of alternative embodiments of leads coupled to a rail in a level-two package of the present invention.
Figure 16C:
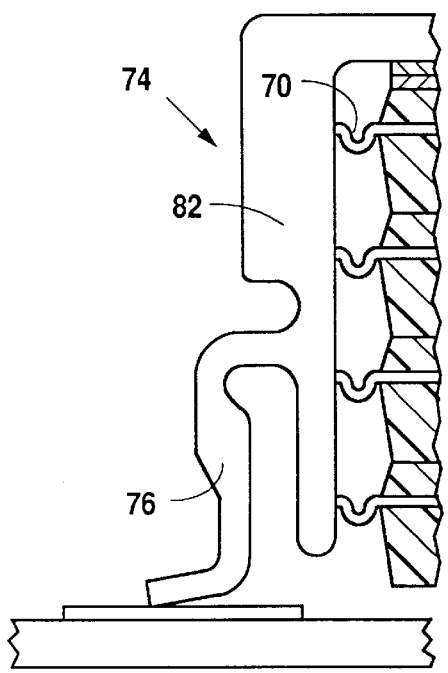
Figure 16D:
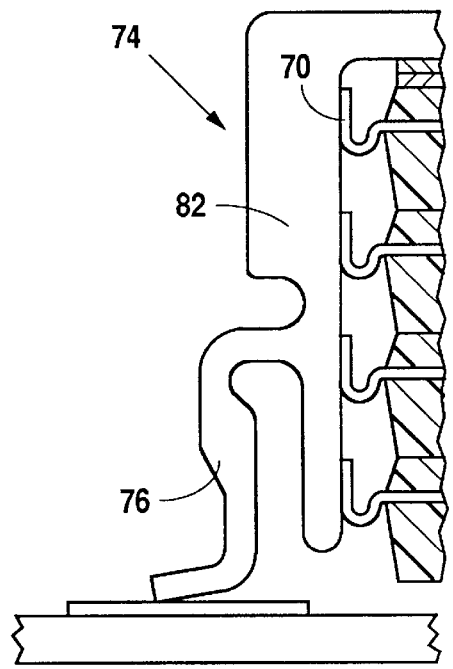

FIGS. 16b–d illustrate that there are various alternative embodiments for leads 70. In the embodiments illustrated in FIGS. 16b–d, leads 70 do not contact the wide side 82 of the rail 74, but instead directly contact the narrow edge 80 (not shown) of the rail. The leads 70 preferably are soldered to rails 74.

As discussed above, FIGS. 15 and 17 illustrate an embodiment of rail 74 which includes an extension 78. More specifically, FIG. 15 illustrates an extension 78 which includes tabs 90 spread along the lower edge thereof. Note that tabs 90 are one-half the thickness of the edge 91 of rail extension 78. Note also that alternating tabs 90a and 90b, while being half the thickness of edge 91, have one side that is flush with either side A of extension 78 or side B (not visible in FIG. 15), which is the side opposite to side A. Tabs 90a and 90b may be formed as illustrated by any suitable metal fabrication technique such as etching.

Figure 18A:
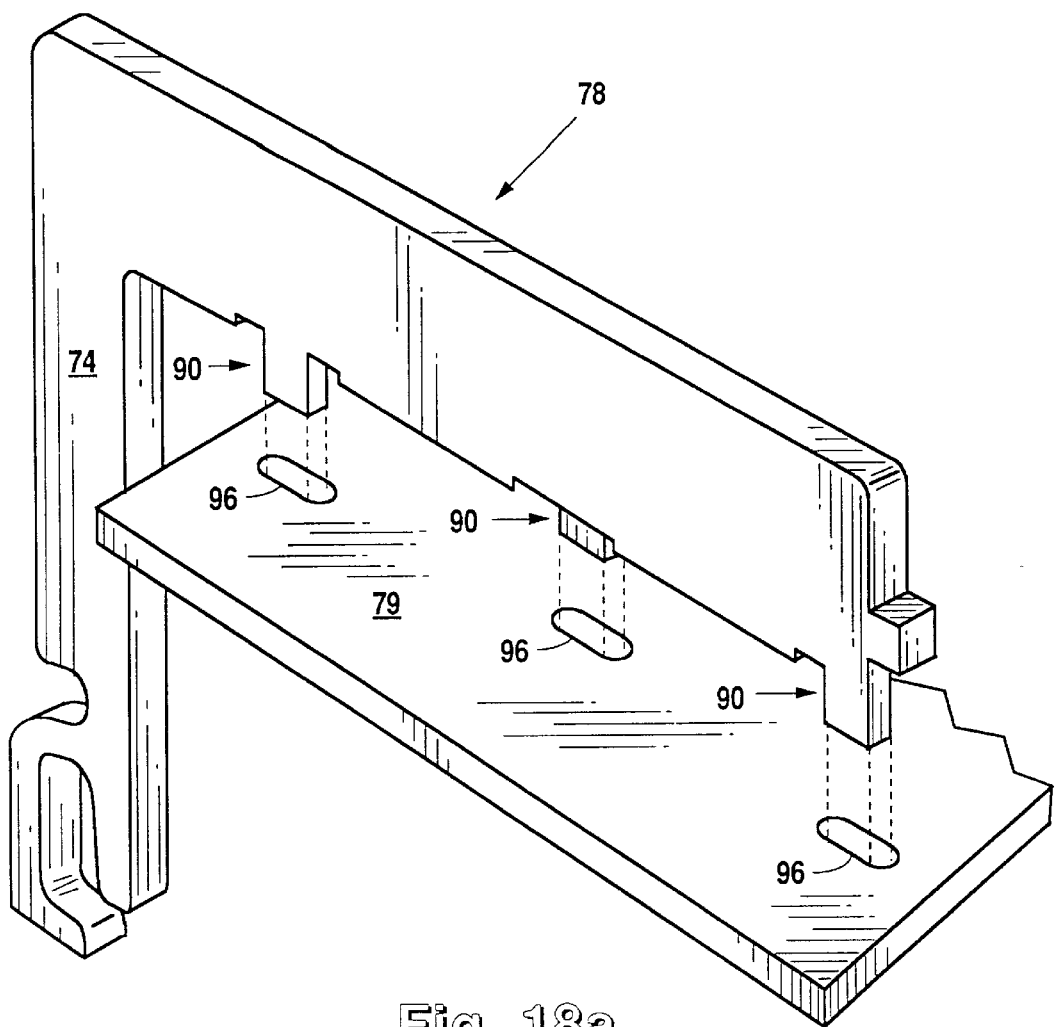
FIG. 18a is a perspective view of how the tabs of a rail are inserted into holes in a top member in accordance with the present invention.
Figure 18B:
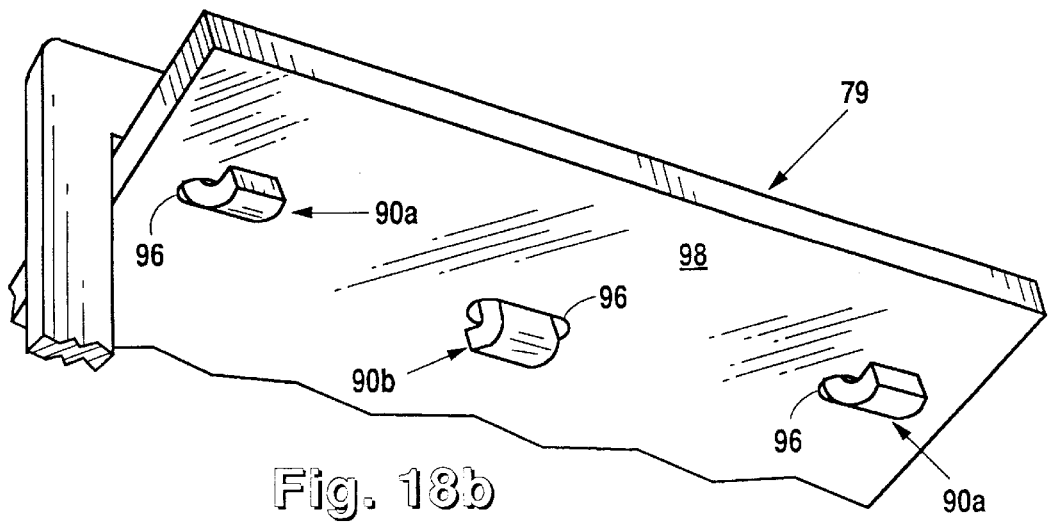
FIG. 18b is an enlarged isometric view of the tabs of a rail being bent against a top member so that the rail is secured to the top member in accordance with the present invention.

FIGS. 17, 18a and 18b illustrate the function of tabs 90. FIG. 17 illustrates rails 74 having extensions 78 coupled by their tabs 90 to cap 79. Cap 79 may be made with seven mil thick FR-4 or polyimide circuit board substrate. Detentes or holes 96 are machined in cap 79 in locations to accommodate tabs 90 of rail 74. See FIG. 18a. Tabs 90 are inserted through holes 96 and then bent by a roller mechanism to flatten the tabs against surface 98 of cap 79. See FIG. 18b. Since tabs 90a and 90b are half the thickness of extension 78 they bend more easily. The positioning of tabs 90a and 90b with respect to sides A and B of extension 78 causes these tabs to be bent in opposite directions resulting in more secured coupling between the rail extension 78 (not visible) and the cap 79. See FIG. 18b. Note that in assembling the horizontal level-two package, the rails 74 are first coupled to cap 79 as illustrated in FIGS. 18a and 18b, and then the stack of level-one packages are coupled with the rail and cap assembly as follows: the uppermost level-one package is positioned flush with the cap 79, and then the rails 74 and leads 70 are mated in the stack together and are soldered together as described above. A completely assembled horizontal level-two package is illustrated in FIG. 17.

Figure 18C:
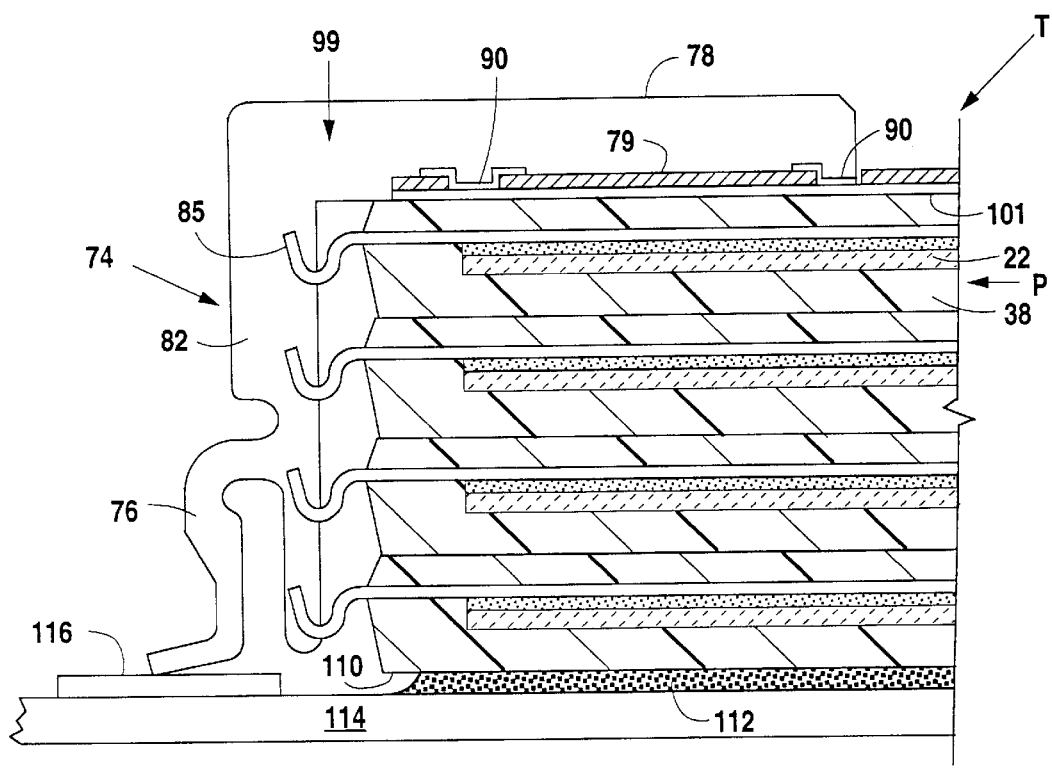
FIG. 18c is a cross-sectional view of a horizontal level-two package with an alternative embodiment of the rails in accordance with the present invention.

FIG. 18c illustrates a cross-sectional side view of a level-two package wherein the rail extension 78 is provided with a shoulder 99 which rests flush with the uppermost level-one package P. Shoulder 99 helps keep the rail extension 78 and the bent tabs 90 in their desired positions, and thereby prevents possible electrical shorting from the uppermost level-one package P to the bent tabs.

The horizontal level-two package illustrated in FIG. 17 provides heat dissipation advantages over the horizontal level-two packages illustrated in U.S. Pat. No. 5,279,029.

Coupling the edge 80 of rails 74 to leads 70 causes the side C2 of the rails to extend outwardly from the stack of level-one packages P so as to form multiple fins 100. Furthermore, rail extensions 78 can also be arranged to act as fins. As discussed above, extensions 78 have tabs 90 which extend from the bottom of the edge 91 for coupling with cap 79. When extensions 78 are coupled to cap 79 in this arrangement, the side of extensions 78 that is wider than edge 91, indicated by reference numeral 102, extends upwardly away from the cap and acts as a fin. Multiple rail extension fins are designated by reference numeral 104. Fins 100 and 104 provide heat dissipation away from the horizontal level-two package T when air is circulated across the fins. Fins 100 and 104 thus act as heat sinks. It should be appreciated that the positioning of fins 100 and fins 104, such as their angle, can be adjusted to accommodate space limitations on the sides and tops of horizontal level-two package T and the direction of air circulation.

Figure 19A:
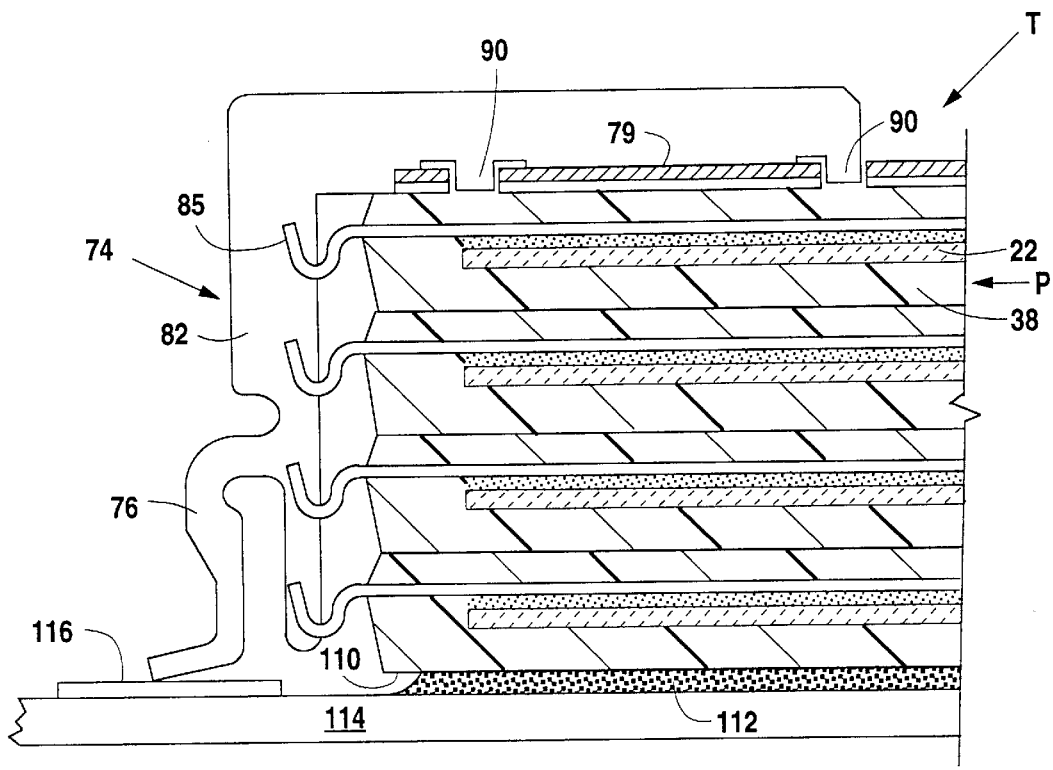
FIGS. 19a–19b are partial cross-sectional views of a horizontal level-two package affixed to a circuit board substrate by alternative embodiments in accordance with the present invention.
Figure 19B:
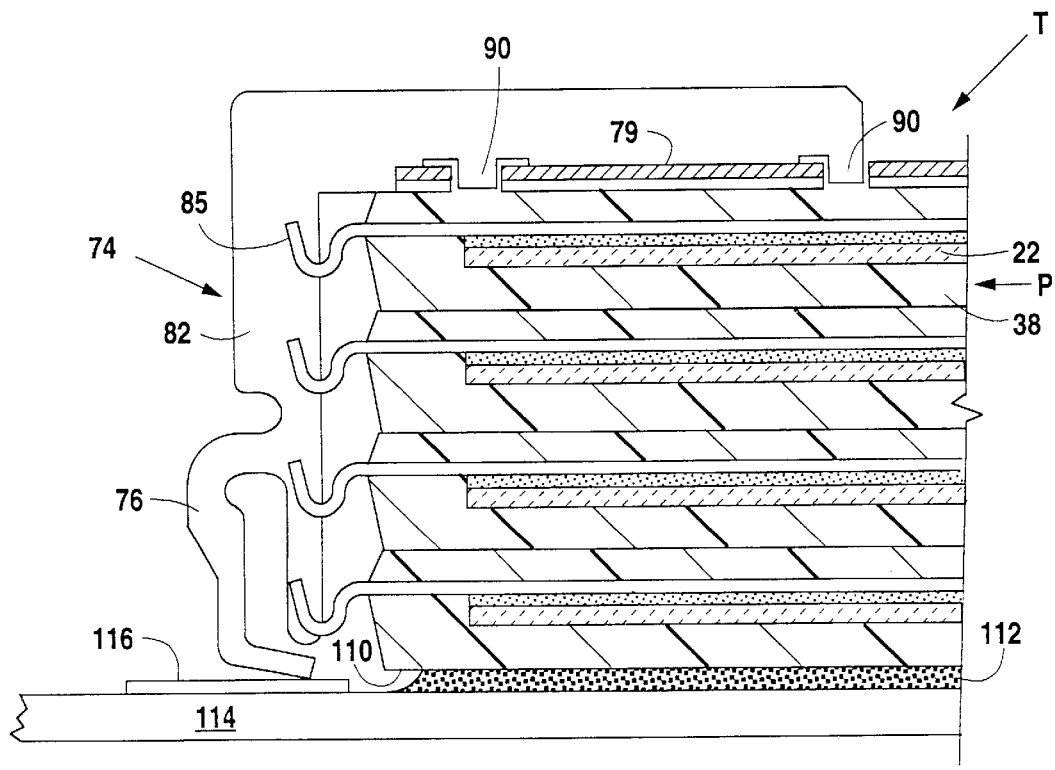

FIGS. 19a, 19b and 20 illustrate how the level-two package T is attached to the circuit board substrate. Level-two package T may be affixed to the circuit board substrate at its base 110 by a layer of thermal-filled organic material 112. The thermal-filled organic material may help conduct heat from the level-two package T to the circuit board substrate 114. Circuit board substrate 114 then conducts heat to the chassis to which it is attached. However, the benefits of layer 112 are likely to be minimal in comparison to the associated expense and burden of adding an additional layer. Note that FIGS. 20a and 20b illustrate a cross-sectional view of horizontal package T.

Circuit board substrate mounting portion 76 of rail 74 is soldered to contacts 116 of circuit board substrate 114. FIGS. 19a and 19b illustrate how the circuit board substrate mounting portion 76 can either extend away from the level-two package T in a J-lead configuration (FIG. 19a) or towards the package T in a gull-wing configuration (FIG. 19b). The J-lead configuration in FIG. 19a provides easier access to the solder securing the mounting portion 76 to contact 116. However, the gull-wing configuration of FIG. 19b saves the space necessary for the J-lead in FIG. 19a to extend away from package T.

Figure 21:
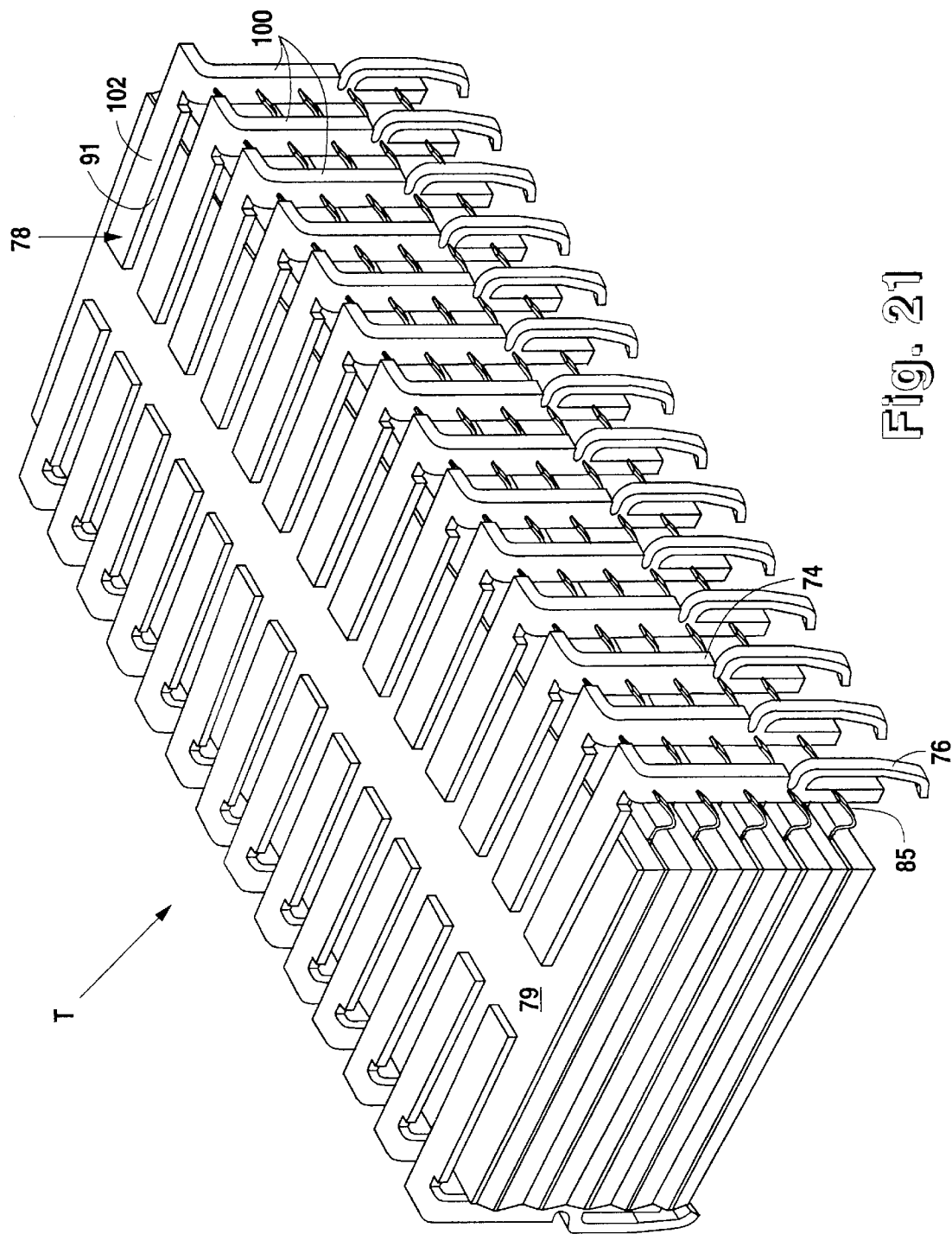
FIG. 21 is an isometric view of an alternative embodiment of a horizontal level-two package in accordance with the present invention.

FIG. 21 illustrates yet another embodiment of a horizontal level-two package arrangement. In this embodiment, rail extensions 78 are bent such that side 102 of the extensions rest flush with the upper surface of the cap 79. Since a larger surface area of rail extension 78 makes contact with the cap 79, more heat can be conducted through rails 74. However, the heat dissipation advantages associated with the configuration illustrated is likely outweighed by the additional cost associated with providing rails 74 with a bend.

Figure 22:
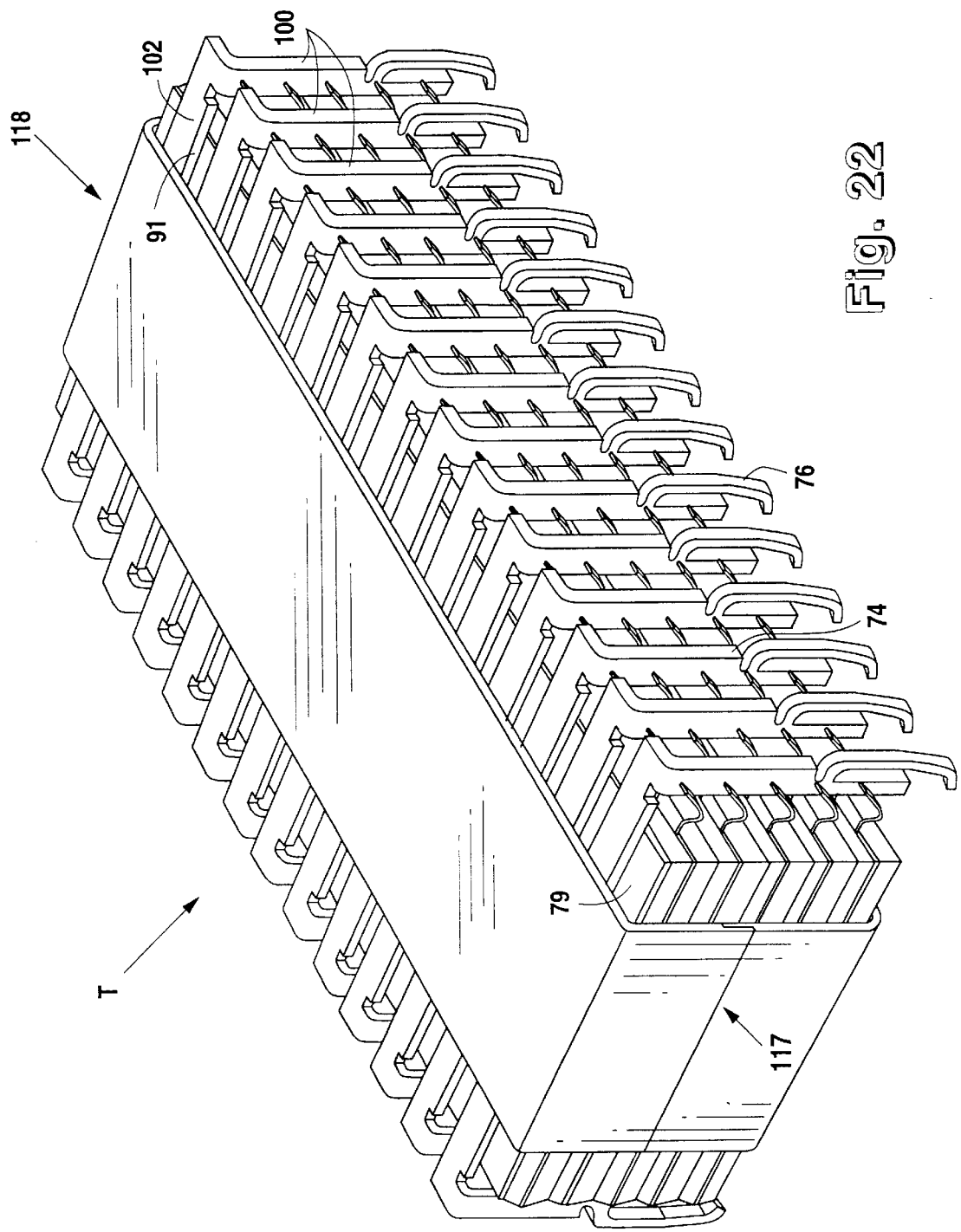
FIGS. 22 and 22a are isometric views of the horizontal level-two package in FIG. 21 having a saddle in accordance with the present invention.
Figure 23A:
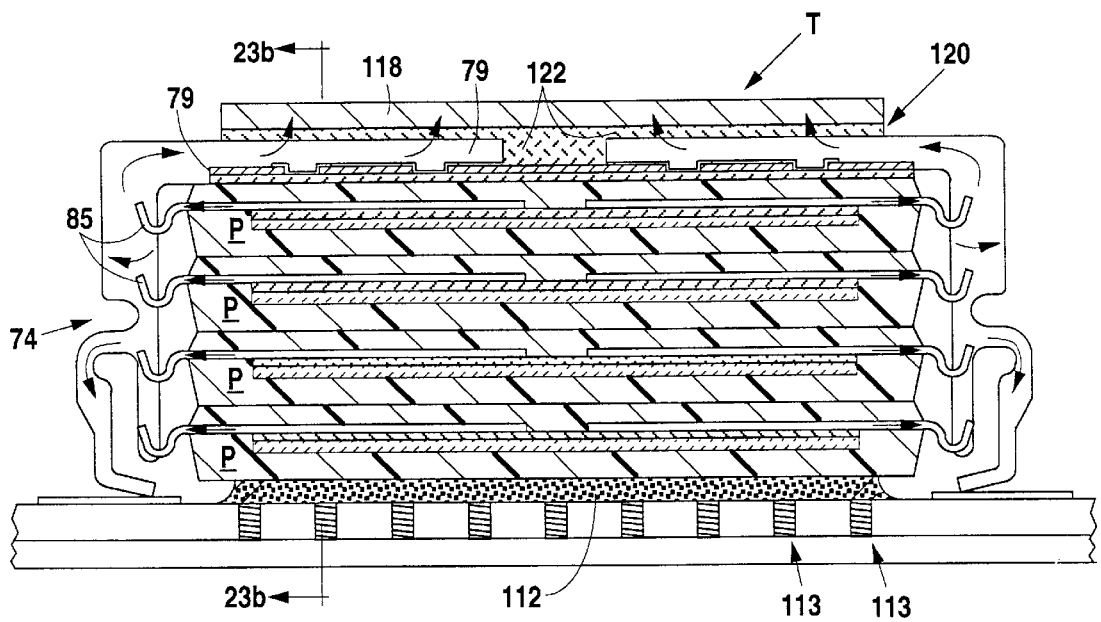
FIG. 23a is a cross-sectional view of the horizontal level-two package of FIG. 22 attached to a circuit board substrate.
Figure 23B:
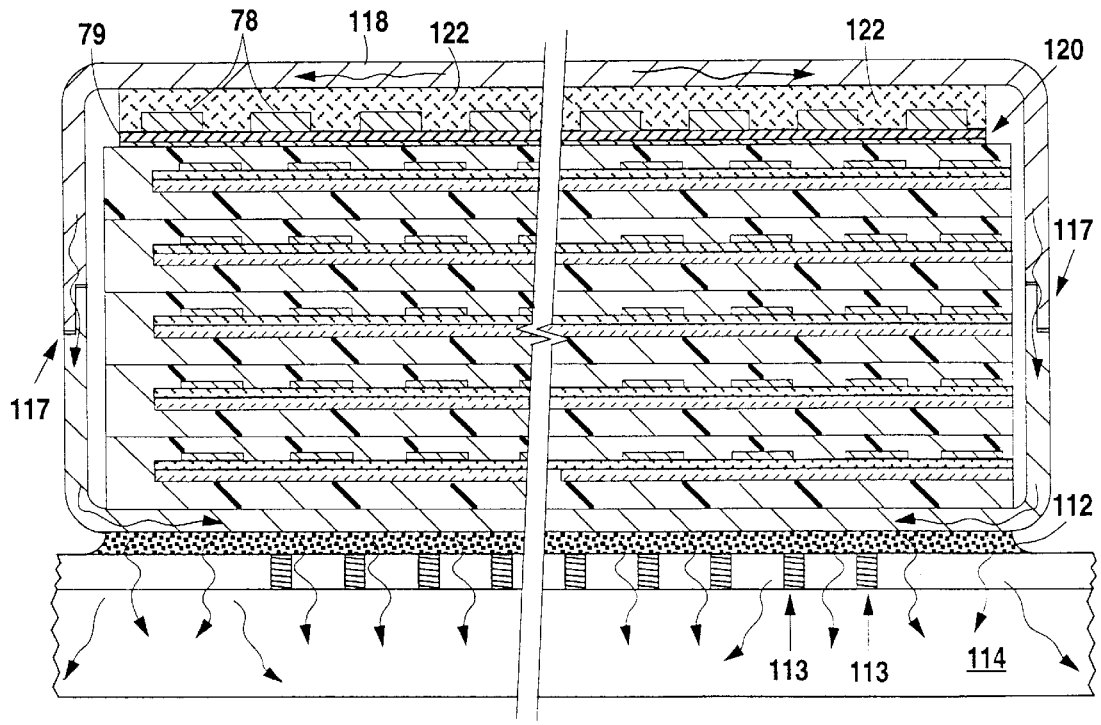
FIG. 23b is a side view of the horizontal level-two package of FIG. 22 affixed to a circuit board substrate.

Additional heat-sink capabilities can be provided to the embodiment illustrated in FIG. 21 by wrapping the level-two package T with a copper or a beryllium copper alloy (3) band or saddle 118 as is illustrated in FIGS. 22, 23a and 23b. As illustrated, the saddle 118 is wrapped around the axis of the level-two package T not containing leads 70 and fins 100 so as to avoid interference with the heat dissipation capabilities of the fins. In the package T illustrated in FIG. 22, the saddle 118 is wrapped around the long-axis. The saddle 118 typically comprises two or more sections which are soldered together on the sides of package T such as at the point indicated by reference numeral 117 on the visible side of package T illustrated in FIG. 22. The saddle 118 preferably has a cross-sectional thickness of 6 mils. Saddle 118 is adhered only to the upper surface of rail extensions 78. A one to two mil thick layer 120 of dielectric-adhesive is used to adhere the saddle 118 to the rail extensions and is used to fill in the space 122 underneath saddle 118 and between the rail extensions. The dielectric properties of layer 120 prevent electrical conductivity or shorting between rails 194.

FIG. 23b illustrates the long axis cross-section of the level-two package T illustrated in FIG. 22. As illustrated, saddle 118 comprises two sections which are wrapped around the entire level-two package and soldered together at points 117. Saddle 118 may be adhered on its bottom surface 119 to circuit board substrate 114 by a layer of thermal filled organic 112. Saddle 118 conducts heat on the outside of level-two package T to the thermal filled organic layer 112. The thermal filled organic layer 112 then conducts the heat through thermally conductive vias 113 in the circuit board substrate 114, and the heat is conducted through the circuit board substrate to the chassis to which the circuit board substrate is attached. The travel of the heat away from the level-two package T is represented by the arrows in FIGS. 23a and 23b.

The use of saddle 118 is particularly beneficial in military or space-craft applications where space usage is of prime importance. In such applications, there is no room for electric fans or other air-circulating means to circulate air over heat-sinks, such as fins 104 in the horizontal level-two package embodiment illustrated in FIG. 17. Heat-sinks, such as fins 104, obtain the most effective heat-sinking results when there is circulating air. Saddle 118 works effectively as a heat sink without circulating air by drawing heat from a large area of contact with package T and conducting the heat by a large path to a large area of the circuit board substrate. In comparison, the level-two package T embodiment in FIG. 17 works less effectively to dissipate heat than the package T with a saddle when there is no air circulation because the rails 74 and extensions 78 most draw heat from a more concentrated area of contact with package T and conduct the heat over a more concentrated path to a more concentrated area of contact with the circuit board substrate.

FIG. 24 illustrates still another embodiment of a horizontal level-two package T. This embodiment will be referred to as the inverse saddle design. In this design, rails 74 do not have extensions 78 that extend across the upper surface of the uppermost package P, rather they have extensions 122 that extend across the bottom surface of the lowermost package P. Extensions 122 may be interfaced with the lower surface of the lowermost package P through an approximately 7 mil thick layer 124 of FR-4 or polyimide material. Layer 124 compares to cap 79 illustrated in FIGS. 19, 20a, and 20b. Extensions 122 may be provided with tabs similar to tabs 90 illustrated in FIG. 16 for insertion into holes in the polyimide material. However, tabs are likely not necessary in this embodiment since as will be described below the extensions are securably sandwiched between package T and the circuit board substrate 114. Rail extensions 122 may be interfaced to the circuit board substrate 114 through three heat conductive layers 132, 134, and 136. Layer 132 directly contacts the lower surface 130 of rail extensions 122 and fills in the spaces between the rail extensions 122. This material may be an electrically insulative, thermally conductive epoxy such as an aluminum nitride filled epoxy. Layer 134 may be an approximately 4 mil thick layer of a highly effective thermal conductive material such as beryllium copper alloy (3) or a copper alloy (110 or 197) sandwiched between layers 132 and 136. Layer 136 interfaces layer 134 to circuit board substrate 114 and may be a thermally conductive material such as thermal grease. The inverse saddle design illustrated in FIG. 24 is useful, for example, in applications where there is no space available at the upper surface of package T for heat sinks and the heat, therefore, has to be drawn to the bottom surface of package T.

Figure 25A:
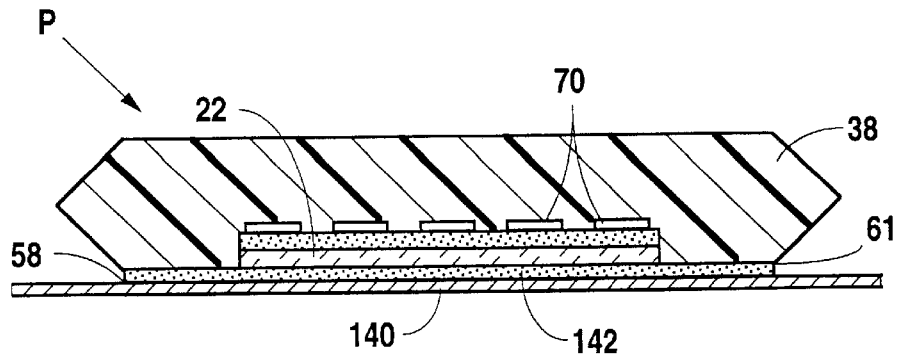
FIG. 25a is an alternative embodiment of packaging an integrated circuit die element.
Figure 25B:
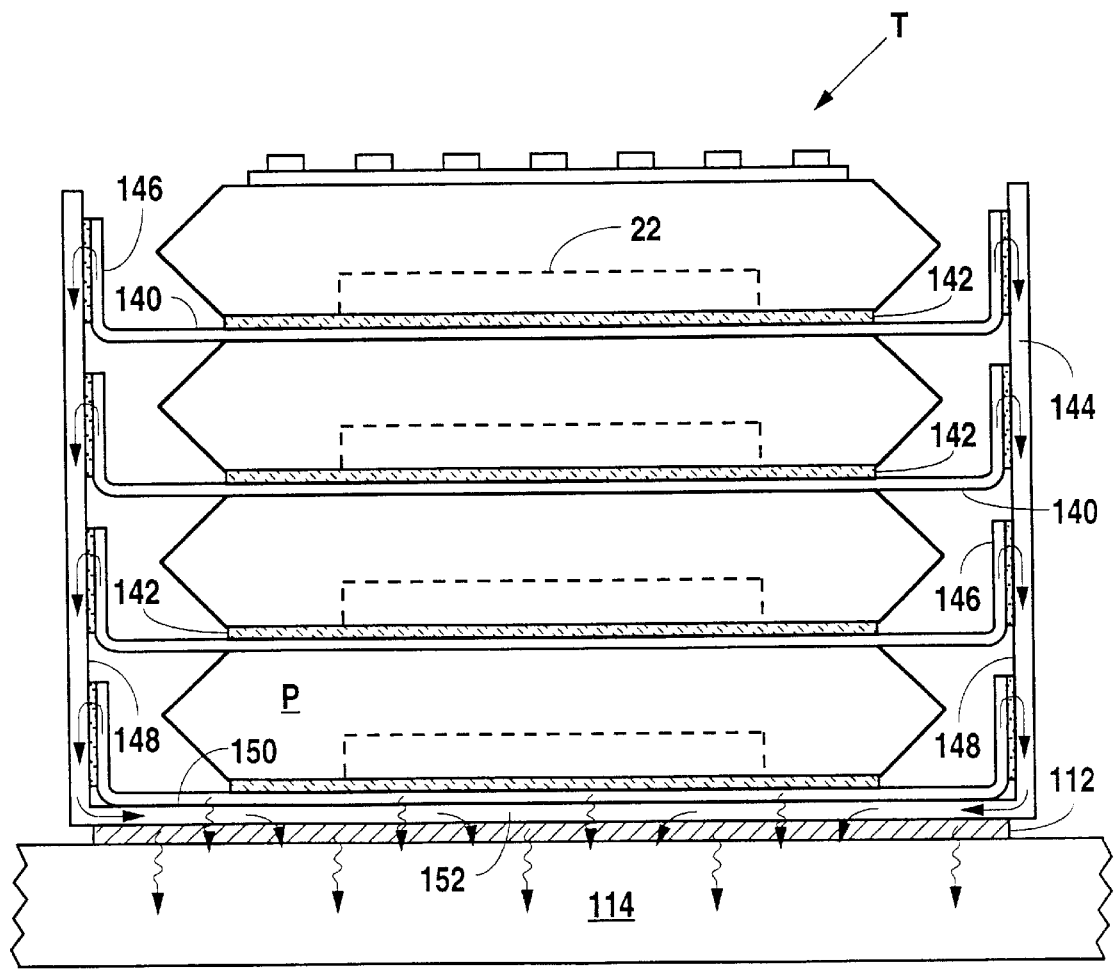
FIG. 25b is an alternative embodiment of a level-two package, which is attached to a circuit board substrate, in accordance with the present invention.

FIGS. 25a and 25b illustrate additional embodiments for high heat-dissipation. FIG. 25a illustrates a level-one package P comprising a die element 22 with casing 38 on the upper and side surfaces and a metal layer 140 affixed to the lower surface 58 of the die element and lower surface 61 of the casing with electrically and thermally conductive adhesive 142. As illustrated, metal layer 140 may extend from the sides of package P. The metal layer is preferably made of a good thermal and electrical conductor such as copper. Leads 70 may extend from the sides of package P but are not visible in the illustrated axis. Metal layer 140 acts as an effective heat sink for package P. Metal layer 140 may also be used as an electrical conductor by electrically coupling the metal layer to voltage ground or some other reference voltage (Vss).

Multiple level-one packages P of the type illustrated in FIG. 25a may be put into a stacked horizontal level-two package T arrangement as illustrated in FIG. 25b. Level-two package T may include leads extending from the sides of packages P, but the leads are not visible in the illustrated axis. Any of the lead and rail coupling embodiments discussed above with reference to FIGS. 17 and 21 may be used. The level-two package T of this embodiment includes a partial band, or partial saddle, or an outer metal wrap-around layer 144 that wraps around the sides and bottom of the axis of the package T which avoids interference with any leads and/or rails. The metal wrap-around layer 144 is preferably made of copper or a similar thermally conductive material. Any ends 146 of metal layer 140 that extend from the sides of packages P may be bent to be substantially flush with the inner wall 148 of metal wrap-around layer 144. The ends 146 of metal layers 140 may be affixed to the inner wall 148 by a thermally conductive solder, epoxy or other suitable material. The bottom surface 150 of the metal layer 140 of the lowermost level-one package P rests on the lower surface 152 of the metal wrap-around layer 144.

Figure 22A:
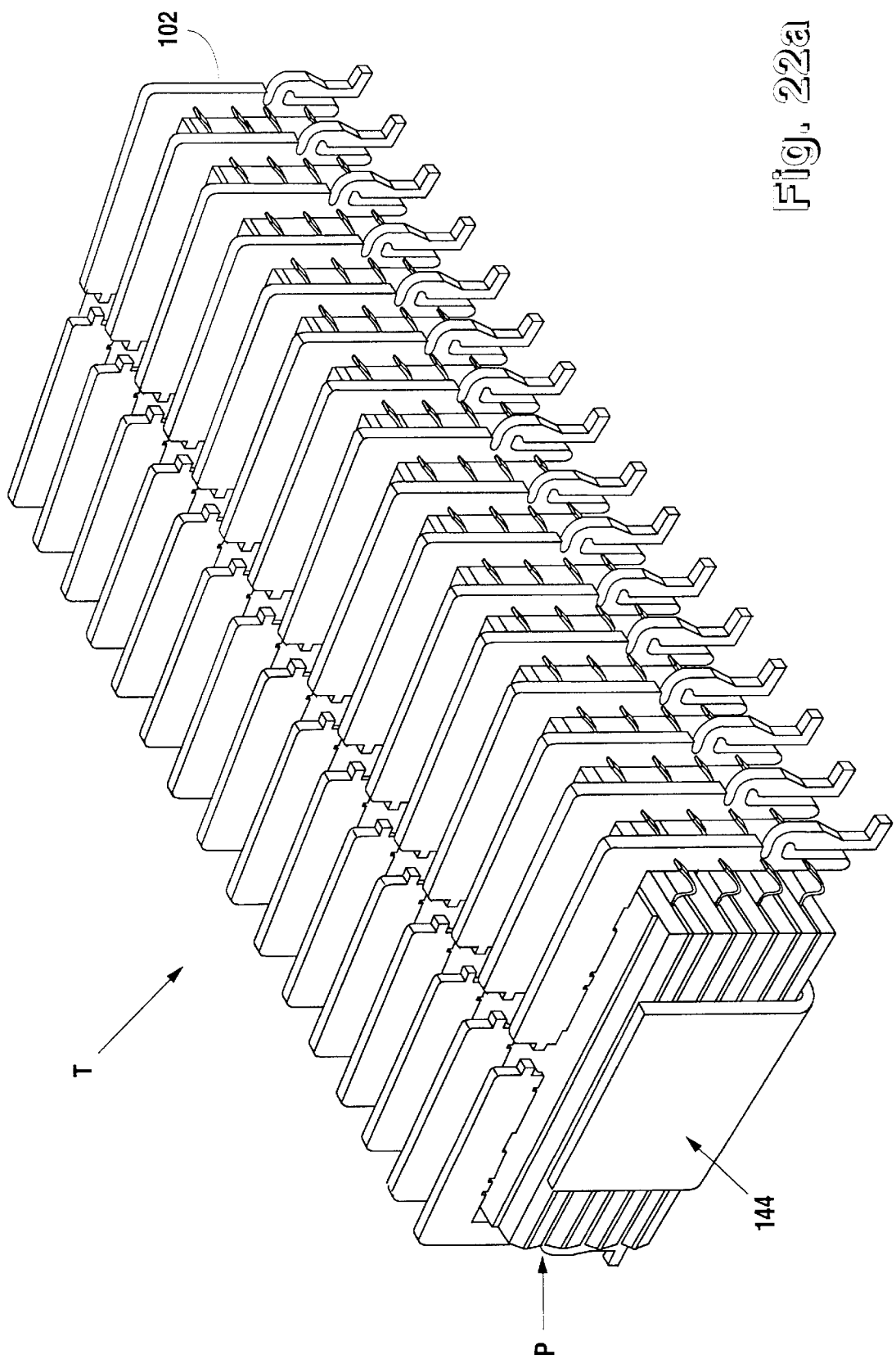

Package T may be adhered to a circuit board substrate 114 by a layer of thermal-filled organic 112. In this arrangement, package T may dissipate heat from each metal layer 140 to metal wrap-around layer or partial saddle 144 and into layer 112 and the circuit board substrate 114, as represented by the arrows in FIG. 25b. The level-two package T may include further heat-dissipation capability if it is provided with rail and lead arrangements such as discussed above in reference to FIGS. 17 and 21. FIG. 22a illustrates a partial saddle 144 in combination with vertically oriented rail fins 102 which is the preferred embodiment for high heat dissipation applications. Efficient heat dissipation may be provided through just the contact of the metal layer 140 of the lowermost level-one package P with the lower surface 152 of metal wrap around layer 144. Thus, contact by all of metal layers 140 with the metal wrap-around layer 144 may not be necessary. Of course, a greater area of contact by thermal conductors with package P will provide a greater surface area for heat dissipation.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to-those embodiments described herein will be readily apparent to those skilled in the art and are encompassed within the spirit of the invention and the scope of the following claims.

What is claimed is:

1. A modular integrated circuit package comprising:
    a plurality of level-one integrated circuit packages, each including an integrated circuit element formed on a semiconductor substrate, and a lead frame electrically coupled to said integrated circuit element and having a plurality of electrical interconnect leads extending therefrom and providing an electrical path to said integrated circuit element, and wherein a select one or more of said leads of said lead frame in each level-one package are inactive;
    wherein said level-one packages are aligned in a stacked configuration so that said leads are aligned in an array of columns; and
    wherein all of said leads in said columns external to said level-one packages are electrically coupled.

2. The modular integrated circuit package of claim 1, wherein said leads have a section external to said package and a section internal to said package, and wherein said external section of said one or more select inactive leads of each package is disconnected.

3. The modular integrated circuit package of claim 1, wherein said leads have a section external to said package and a section internal to said package, and wherein said electrical path of said internal section of said one or more select inactive leads is disconnected.

4. The modular integrated circuit package of claim 1, wherein said one or more select inactive leads of each level-one package provide a unique address for each package.

5. The modular integrated circuit package of claim 1, wherein said one or more select inactive leads of each level-one package provide a unique data word bit-position for each package.

6. A modular integrated circuit package comprising:
    a plurality of level-one integrated circuit packages each having a plurality of electrical interconnect leads extending therefrom;
    wherein said level-one packages are aligned in a stacked configuration so that said leads from said level-one packages are aligned in an array of columns; and
    a plurality of thermally and electrically conductive rails mounted adjacent to and oriented with said columns, said rails being electrically and thermally coupled to some or all of said leads in said columns.

7. The modular integrated circuit package of claim 6, wherein each level-one integrated circuit package comprises:
    an integrated circuit element, said integrated circuit element comprising an integrated circuit formed on a semiconductor substrate, and having a plurality of electrical interconnect leads extending therefrom, and having an upper surface, a lower surface and a perimeter wall;
    an electrically insulating casing covering said upper surface and said perimeter wall of said integrated circuit element; and
    wherein said leads extend from said integrated circuit element through a portion of said casing covering said perimeter wall.

8. A modular integrated circuit package comprising:
    a plurality of level-one integrated circuit packages each having a first and a second major surface;
    wherein said level-one packages are arranged in a stacked configuration; and
    heat transfer material, located between and in contact with adjacent major surfaces of at least one pair of adjacent level-one packages, for facilitating heat transfer in said modular integrated circuit package.

9. The modular integrated circuit package of claim 8, wherein each level-one integrated circuit package comprises:

an integrated circuit element, said integrated circuit element comprising an integrated circuit formed on a semiconductor substrate and having a plurality of electrical interconnect leads extending therefrom;

an electrically insulating casing surrounding said integrated circuit element; and wherein said leads extend from said integrated circuit element through a portion of said casing.

10. The modular integrated circuit package of claim 8, wherein each level-one integrated circuit package comprises:

an integrated circuit element, said integrated circuit element comprising an integrated circuit formed on a semiconductor substrate and having a plurality of electrical interconnect leads extending therefrom, and having an upper surface, a lower surface and a perimeter wall;

an electrically insulating casing covering said upper surface and said perimeter wall of said integrated circuit element; and wherein said leads extend from said integrated circuit element through a portion of said casing covering said perimeter wall.

11. The modular integrated circuit package of claim 8, wherein said heat transfer material is an adhesive.

12. The modular integrated circuit package of claim 11, wherein said adhesive is a thermally conductive adhesive.

13. The modular integrated circuit package of claim 9, wherein said leads from said level-one packages are aligned in an array columns and some or all of said leads in said columns are electrically coupled.

14. The modular integrated circuit package of claim 13, wherein a plurality of electrically and thermally conductive rails are mounted adjacent to and oriented with said columns, and said rails are electrically and thermally coupled to some or all of said leads in said columns.

15. The modular integrated circuit package of claim 9, wherein said heat transfer material is an adhesive.

16. The modular integrated circuit package of claim 15, wherein said adhesive is a thermally conductive adhesive.

17. The modular integrated circuit package of claim 10, wherein said leads from said level-one packages are aligned in an array of columns and some or all of said leads in said columns are electrically coupled.

18. The modular integrated circuit package of claim 17, wherein a plurality of electrically and thermally conductive rails are mounted adjacent to and oriented with said columns, and said rails are electrically and thermally coupled to some or all of said leads in said columns.

19. The modular integrated circuit package of claim 10, wherein said heat transfer material is an adhesive.

20. The modular integrated circuit package of claim 19, wherein said adhesive is a thermally conductive adhesive.

* * * * *